United States Patent
Nagao et al.

(10) Patent No.: US 12,295,266 B2
(45) Date of Patent: May 6, 2025

(54) PHOTOSENSOR, SENSOR UNIT, AND OBJECT DETECTION APPARATUS USING PHOTOSENSOR

(71) Applicant: NATIONAL INSTITUTE FOR MATERIALS SCIENCE, Ibaraki (JP)

(72) Inventors: Tadaaki Nagao, Ibaraki (JP); Duy Thang Dao, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 548 days.

(21) Appl. No.: 17/631,147

(22) PCT Filed: Jul. 30, 2020

(86) PCT No.: PCT/JP2020/029266
§ 371 (c)(1),
(2) Date: Jan. 28, 2022

(87) PCT Pub. No.: WO2021/024909
PCT Pub. Date: Feb. 11, 2021

(65) Prior Publication Data
US 2022/0271211 A1  Aug. 25, 2022

(30) Foreign Application Priority Data
Aug. 2, 2019 (JP) ................................. 2019-142927

(51) Int. Cl.
*H10N 15/10* (2023.01)
*G01J 5/20* (2006.01)
*H10N 19/00* (2023.01)

(52) U.S. Cl.
CPC ............... *H10N 15/15* (2023.02); *G01J 5/20* (2013.01); *H10N 19/00* (2023.02)

(58) Field of Classification Search
CPC . H10N 15/15; H10N 19/00; G01J 5/20; G01J 2003/1213; G01J 2005/103; G01J 3/12; G01J 3/42; G01J 5/046; G01J 5/0802; G01J 5/0853; G01J 5/34; G01J 5/10; G02B 1/005; G02B 5/008; G02B 5/204
See application file for complete search history.

(56) References Cited

U.S. PATENT DOCUMENTS

2017/0268931 A1* 9/2017 Gong ..................... G01J 5/59

OTHER PUBLICATIONS

International Search Report issued Oct. 27, 2020 in International Application No. PCT/JP2020/029266.
(Continued)

*Primary Examiner* — Thanh T Nguyen
(74) *Attorney, Agent, or Firm* — Wenderoth, Lind & Ponack, L.L.P.

(57) ABSTRACT

A photothermal converter using a wavelength selective perfect absorber made of a low-loss metal material or dielectric and a heat detection sensor are combined to develop a sensor that efficiently converts light of a specific wavelength into heat and further electrically detects the heat. Here, since the wavelength selective perfect absorber of the present invention has a periodic structure, it has high directivity, and can also be used as a small motion sensor or a watching sensor using detection of thermal radiation. In addition, it can also be used as a high-precision small position sensor by being combined with a laser light source matching the resonance wavelength of the sensor.

19 Claims, 15 Drawing Sheets

(56) References Cited

OTHER PUBLICATIONS

Shinpei Ogawa et al., "Wavelength selective uncooled infrared sensor by plasmonics", Applied Physics Letters 100, Jan. 2012, pp. 021111-1 to 021111-4.

Thang Duy Dao et al., Hole Array Perfect Absorbers for Spectrally Selective Midwavelength Infrared Pyroelectric Detectors, ACS Photonics, Jun. 3, 2016, pp. 1271-1278.

Jonathan Y. Suen et al., "Multifunctional metamaterial pyroelectric infrared detectors", Optica Feb. 2017, vol. 4, No. 2, pp. 276-279.

H. T. Miyazaki et al., "Thermal emission of two-color polarized infrared waves from integrated plasmon cavities", Applied Physics Letter 92, Apr. 2008, pp. 141114-1 to 141114-3.

Ivan Celanovic et al., "Resonant-cavity enhanced thermal emission", Physical Review B 72, Aug. 2005, pp. 075127-1 to 075127-6.

Anh Tung Doan, et al., "Gires-Tournois resonators as ultra-narrowband perfect absorbers for infrared spectroscopic devices", Optics Express, Jun. 2019, vol. 27, No. 12, pp. A725-A737.

David W. Lynch et al., "Comments on the Optical Constants of Metals and an Introduction to the Data for Several Metals", Handbook of Optical Constants of Solids, 1998, pp. 275-316,.

H. R. Philipp, "Silicon Dioxide ($SiO_2$), Type α (Crystalline)", Handbook of Optical Constants of Solids, 1985, pp. 719-747.

Mark Auslender et al., Doped n-Type Silicon (n—Si), Chapter 6, Handbook of Optical Constants of Solids III, 1998, pp. 155-186.

Thang Duy Dao et al., "An On-Chip Quad-Wavelength Pyroelectric Sensor for Spectroscopic Infrared Sensing", Infrared Sensors, Advanced Science 2019, 6, 1900579 (1-9).

Victoria Corless, "Expanding the Capabilities of IR Spectroscopy", Advanced Science News, Sep. 23, 2019, pp. 1-5.

Partial Search Report issued Aug. 9, 2023 by the European Patent Office in corresponding European Patent Application No. 20849844. 4.

Govind Dayal et al., "Design of multi-band metamaterial perfect absorbers with stacked metal-dielectric disks", Journal of Optics, Institute of Physics Publishing, Bristol GB, vol. 15, No. 5, pp. 1-7, Apr. 23, 2013.

Tao Liu et al., "Design and Analysis of Frequency-Selective Surface Enabled Microbolometers", Infrared Technology and Applications XLII, Proceedings of SPIE, vol. 9819, pp. 98191V-1 to 98191V-8, May 20, 2016.

Shinpei Ogawa et al., "Wavelength- or Polarization-Selective Thermal Infrared Detectors for Multi-Color or Polarimetric Imaging Using Plasmonics and Metamaterials", Materials 2017, vol. 10, No. 493; doi: 10.3390/ma10050493, pp. 1-16; 16 pages.

Summons to attend oral proceedings pursuant to Rule 115(1) EPC issued Feb. 7, 2025 in corresponding European Patent Application No. 20849844.4, 10 pages.

Jianfa Zhang et al., "Controlling the Colour of Metals: Intaglio and Bas-Relief Metamaterials", Arxiv.Org, Cornell University Library, 201 Olin Library Cornell University Ithaca, NY 148853, Nov. 9, 2010 (Nov. 9, 2010), XP080461364, DOI: 10.1364/OE.19.023279, 3 pages.

Extended European Search Report issued Nov. 24, 2023 in corresponding European Patent Application No. 20849844.4, 19 pages.

Communication pursuant to Article 94(3) EPC issued Aug. 12, 2024 in corresponding European Patent Application No. 20849844.4, 9 pages.

Ginn James et al., "Polarized infrared emission using frequency selective surfaces", Optics Express, vol. 18, No. 5, Mar. 1, 2010, 7 pages.

Nemati Arash et al., "Tunable and reconfigurable metasurfaces and metadevices", Opto-Electronic Advances, vol. 1, No. 5, Jun. 29, 2018, 25 pages.

Felix Gildas et al., "Review of nanostructure color filters", Journal of Nanophotonics, vol. 13, No. 2, Jun. 17, 2019, 27 pages.

Changhyun Yi et al., "Role of Wood's anomaly in the performance of metamaterial absorbers with periodicity comparable to wavelength", Journal of Physics D: Applied Physics Institute of Physics, Publishing, Bristol, GB, vol. 49, No. 19, Apr. 13, 2016, 7 pages.

Cheng C-W et al., "Wide-angle polarization independent infrared broadband absorbers based on metallic multi-sized disk arrays", Optics Express 20, 10376, May 1, 2012, 6 pages.

Translation of JP Office Action, Notice of Reasons for Refusal dated Nov. 8, 2022 in corresponding Japanese Patent Application No. 2021-537272, 3 pages.

\* cited by examiner

PHOTOSENSOR, SENSOR UNIT, AND OBJECT DETECTION APPARATUS USING PHOTOSENSOR

TECHNICAL FIELD

The present invention relates to a photosensor that has a simple periodic structure, has high wavelength resolution and angular resolution, and detects light by converting light into heat. The present invention also relates to a sensor unit in which a plurality of such photosensors is arranged. The present invention also relates to an object detection apparatus that detects the presence and movement of an object using such a photosensor.

BACKGROUND ART

Infrared spectroscopy can obtain information regarding atomic molecular vibration and electrical properties of a substance. Therefore, infrared spectroscopy is used for identification of substances and evaluation of physical properties in a wide range of academic fields such as material science and infrared astronomy, and greatly contributes to development of the academic fields. In addition, a radiation thermometer and a thermography are apparatuses capable of measuring a temperature in a non-contact manner by measuring thermal radiation of a substance. Further, industrial and social applications related to radiation thermometer and thermography are rapidly progressing. In addition, a gas sensor by non-dispersive infrared absorption method (NDIR) is a sensor that detects the concentration of gas molecules by causing gas molecules to absorb infrared rays emitted from a light source and measuring the transmittance of light having a wavelength matching the absorption of the gas. Further, since the gas sensor is highly sensitive with little deterioration of the sensor element, there is an increasing need as a gas detection method.

In the above-described infrared spectroscopy, for example, in Fourier transform spectroscopy, the size of an interferometer is several tens of centimeters, and it is difficult to reduce the size. In addition, the angle-resolved measurement of thermal radiation requires a complicated sample stage or a gonio stage equipped with a spectrometer, resulting in large-scale. In addition, in infrared temperature measurement, when a material having an unknown emissivity is measured, the correspondence relationship between the intensity of light and the temperature is not known, and thus the accuracy is not guaranteed. In order to solve the above problems, a two-wavelength type radiation thermometer is commercially available as an improved type. However, the two-wavelength type radiation thermometer is effective for a material in which the emissivity hardly changes with respect to the wavelength, but when the emissivity changes with respect to the wavelength, the accuracy is not guaranteed, and multi-wavelength measurement is required. In the gas sensor by the non-dispersive infrared absorption method, as the detection wavelength width of the infrared ray has a narrowband, the absorption of gas molecules can be accurately and selectively measured. However, when it is difficult to separate a plurality of molecular species due to overlapping of spectra in one wavelength measurement, multi-wavelength measurement is desired. As described above, there is room for improvement in the conventionally proposed infrared spectroscopy.

Specifically, in order to improve the performance of infrared spectroscopy, it is desired to perform multi-wavelength measurement together with high wavelength resolution. For example, at the time of temperature sensing, by increasing the wavelength resolution, the distance between two wavelengths close to each other can be reduced, and the emissivity can be handled as being substantially constant in the range of the distance between the two wavelengths close to each other, and the temperature can be obtained. Alternatively, by performing multi-wavelength measurement, even when the wavelength dependency of the emissivity is large, the function of the emissivity and the temperature can be obtained at the same time. If there is a small light detection element capable of detecting light of a plurality of wavelengths with high wavelength resolution, it is possible to measure an accurate temperature even if the emissivity is unknown. In addition, in the non-dispersive infrared absorption method, even in a case where spectra of a plurality of types of gases overlap with each other, it is also possible to separate and measure the amount of each gas by multi-wavelength measurement.

As described above, a photothermal conversion type infrared sensor in which a heat sensing material and a perfect absorber that absorbs light of a specific wavelength and generates heat are combined has been proposed in order to improve measurement accuracy and reduce the size of a measurement apparatus. As the perfect absorber used in these sensors, a dielectric photonic structure or a metal plasmonic structure is used. Unlike wavelength discrimination by a macro stacked dielectric filter, the perfect absorber is formed by two-dimensional patterning, and is suitable for miniaturization and multi-wavelength light detection elements (Non-Patent Literature 1 to 3). However, the microfabrication pattern and process of these perfect absorbers is complex. In addition, the resolution of a sensor using a perfect absorber is usually about 0.5 µm (Q factor is about 10) in a mid-infrared band at a detection wavelength of about 5 µm, and is much broader than the vibration of solid molecules. Furthermore, there has been no practical example of a photothermal conversion type infrared light detection element having such directivity in the perpendicular direction that the acceptance angle is less than ±1° together with wavelength selectivity of less than 0.1 µm. Therefore, it is desired to realize an on-chip small microelement having high wavelength resolution, high directivity, and multiple wavelengths with a simple structure. In addition, it is necessary to narrow the resonance wavelength width of the perfect absorber by using a dielectric or a metal having a small loss as a material to be used. For example, Au, Al, Si, and Ge in the infrared band, Al in the ultraviolet band, and Au or Ag in the visible band are suitable. In the case of a metal material, it is desired that the value of figure of merit (FOM) $-\varepsilon_1/\varepsilon_2$ is about 3 or more at the operating wavelength. In addition, in the above description, it has been described that detection of a plurality of wavelengths is required as an example, but a single wavelength sensor having high resolution and directivity is also very useful. Furthermore, it goes without saying that such a sensor is also very useful for light in a wavelength range (for example, a wide wavelength range including a visible light range, and a lower range side and a higher range side than the visible light range) other than infrared rays.

FIG. 1 illustrates an example of a perfect absorber with four different operating principles. Various perfect absorbers have been proposed so far. The operating principle of many perfect absorbers is mostly classified into four exemplified in FIG. 1. The perfect absorber according to FIG. 1(a) is a metal-insulator-metal structure (MIM structure) subjected to two-dimensional microfabrication, and is a photosensor having wavelength selectivity in a mid-infrared band. In the structure of the perfect absorber in FIG. 1(a), a strip-shaped metal structure having a finite width as the fifth layer from the lower side (first layer from the upper side) becomes a resonator that confines localized surface plasmons, and the resonance wavelength changes depending on the size of the width of the strip. In addition, in addition to a strip array, there are disk array and hole array type devices, and these devices also exhibit similar characteristics (Non-Patent Literature 4). However, these elements having the MIM structure have a complicated structure, and even if the half width of the wavelength is narrow, the half width is only about 10% of the incident wavelength (Q factor is about 10), and thus, are not suitable for applications in which high wavelength selectivity is required. In particular, for use as a gas sensor, since the bandwidth of the element is too broad as compared to the absorption bandwidth of gas molecules, there is difficulty in separation of a signal of a target gas molecule and a signal of a gas molecule other than the target gas molecule. In addition, in terms of the angular resolution and the directivity of the element, the acceptance angle is open to ±30° or more from the perpendicular direction, and there is almost no directivity. Therefore, in order to provide directivity in a direction perpendicular to the element, an additional optical component such as an aperture is separately required. Note that, in this drawing, the lowermost metal layer, a pyroelectric element layer thereon, and a third metal layer thereon constitute a pyroelectric element heat detection sensor, and an MIM type perfect absorber is mounted thereon as a photothermal conversion element. When light or thermal radiation having a wavelength that resonates with the upper perfect absorber is incident, heat is generated and detected by a heat detection portion immediately therebelow.

On the other hand, a resonator structure in which a deep groove having a narrow width is dug on a flat metal surface as illustrated in FIG. 1(b) can also be used as a perfect absorber. In this case, a resonator effect in the longitudinal direction of the groove occurs, and resonance with a longer wavelength occurs as the groove is deeper. In addition, as the width of the groove decreases, the resonance wavelength thereof increases (Non-Patent Literature 5). Also in the case of the perfect absorber of (b), as in (a), the effect of confining localized surface plasmons is used, and the wavelength width becomes as large as that of (a). In addition, the directivity is not good.

In addition, on the other hand, a wavelength selection structure in which a resonator structure is formed between a stacked distributed reflector and a plasmonic reflection layer as illustrated in FIG. 1(c) has been reported (Non-Patent Literature 6), and a similar structure has also been reported (Non-Patent Literature 7). In these structures, regarding wavelength resolution, a high resolution with a Q factor of 150 or more in theory and 50 or more in experiment can be easily obtained, and a sensor with a high wavelength resolution is possible. However, these structures include a large number of vapor deposition processes, and it is difficult to manufacture a plurality of elements having different film thicknesses in each minute region in a microscale side by side, and it is difficult to realize these structures as on-chip multi-wavelength elements. Furthermore, such a wavelength selective sensor using a stacked perfect absorber has difficulty in that the resonance wavelength shifts together with the incident angle of light.

SUMMARY OF INVENTION

Technical Problem

An object of the present invention is to provide a photosensor having a high-directivity day and with a narrow wavelength band of, for example, Q factor of 50 or more capable of detecting light in a specific wavelength range in an extremely narrow range, incident from a direction very close to a direction perpendicular to a surface of the photosensor, for example, ±1° or less, and an array-type sensor capable of configuring the photosensor as a multi-wavelength sensor having a high wavelength resolution and high directivity by arraying the photosensor.

Solution to Problem

According to one aspect of the present invention, a photosensor which is a sensor capable of detecting light, the photosensor including: an absorber having a surface formed of at least one of a metal and a dielectric and configured to absorb incident light; and means for detecting heat generated by absorption of light by the absorber, in which the absorber absorbs light that is perpendicularly incident on a surface of the absorber and has the same wavelength as a resonance wavelength of the absorber, the surface of the absorber includes a plurality of raised portions that are raised, the surface of the absorber has a periodic structure in which the plurality of raised portions are arranged at a predetermined period such that a one-dimensional or two-dimensional lattice pattern is formed, in the one-dimensional lattice pattern, each of the plurality of raised portions is formed in an elongated manner and is arranged at a first period along a predetermined direction so as to be parallel to each other, widths of the raised portions are 0.3 to 0.7 times the first period, thicknesses of the raised portions are 0.05 to 0.2 times the first period, in the two-dimensional lattice pattern, each of the plurality of raised portions is arranged at a second period so as to be set out in a grid, widths of the raised portions are 0.3 to 0.7 times the second period, thicknesses of the raised portions are 0.05 to 0.2 times the second period, and each of a plurality of modes of surface plasmon polaritons or surface phonon polaritons excited by a surface parallel component of light incident on the absorber and a momentum obtained from the lattice pattern and propagating over the surface of the absorber is in a degenerate state when the light incident on the absorber is incident perpendicularly to the surface and a wavelength is the resonance wavelength.

Here, the raised portions are arranged in the two-dimensional lattice pattern, and the absorption of light by the absorber has no polarization dependency.

In addition, the raised portions are formed in a shape maintains symmetry of the two-dimensional lattice pattern.

Alternatively, the raised portions are arranged in the one-dimensional lattice pattern, and the light absorbed by the absorber is light in a specific polarization direction.

In addition, the light absorbed by the absorber is ultraviolet light, visible light, or infrared light.

In addition, the means for detecting heat may be means for detecting a temperature rise due to the heat.

In addition, the means for detecting a temperature rise may be a pyroelectric element or a bolometer.

In addition, the metal has a thickness of 50 nm or more on surfaces of the raised portions.

In addition, the absorber absorbs 90% or more of light that is perpendicularly incident on the surface of the absorber and has the same wavelength as the resonance wavelength of the absorber.

In addition, the metal is selected from Au, Ag, and Al, and the dielectric is selected from Si, Ge, $Al_2O_3$, $TiO_2$, $SiO_2$, and SiC.

In addition, a bandwidth of light to be detected may correspond to a Q factor of 50 or more.

In addition, a detection sensitivity half-value angle from a direction in which detection sensitivity is highest may be ±1 degree or less.

In addition, the direction in which the detection sensitivity is the highest may be a direction perpendicular to its surface.

According to another aspect of the present invention, there is provided a sensor unit comprising a plurality of the photosensors according to any of the above arranged on a single chip.

Here, at least one of the plurality of the photosensors may have a detection wavelength different from any other one of the plurality of the photosensors.

In addition, the one photosensor is different from any other one of the photosensors in the period in which the raised portions are arranged.

In addition, a thermal barrier may be provided in at least a partial region between the plurality of the photosensors.

According to still another aspect of the present invention, there is provided an object detection apparatus comprising the photosensor according to any of the above for detecting light from an object in a specific direction, and detecting presence or movement of the object.

Here, the object may be selected from the group consisting of an article, an animal, and a human. In addition, the photosensor may detect infrared light.

By combining a perfect absorber having high wavelength selectivity and a heat detection sensor, a sensor having excellent spectral sensitivity can be realized. As a thermal detector, a pyroelectric element, a bolometer, a thermoelectromotive element, or the like is used. The absorption wavelength of the sensor can be flexibly changed by designing the resonance wavelength of the perfect absorber. In addition, unlike a photoelectric type (quantum type) sensor that directly converts light into electricity, the present invention has an advantage that the material to be used and the composition thereof may be the same regardless of the wavelength, the spectral sensitivity curve can be designed only by the structural parameter of the perfect absorber, and the wavelength selectivity can be flexibly adjusted by microfabrication without changing the detection material. In addition, since it is a thermal detection type, it is not necessary to cool at a low temperature like a quantum infrared sensor, and a small and energy saving type sensor is possible.

Such a photosensor can be used as an ultra-small spectrometer or a multi-color imaging sensor since a plurality of photosensors having high wavelength resolution can be mounted on one chip. In addition, by using its high directivity, application as a motion sensor, a gesture sensor, a watching sensor for houses, offices, and hospitals, a small high-accuracy position sensor combined with a laser light source, and the like is possible.

DESCRIPTION OF EMBODIMENTS

Figure 2:
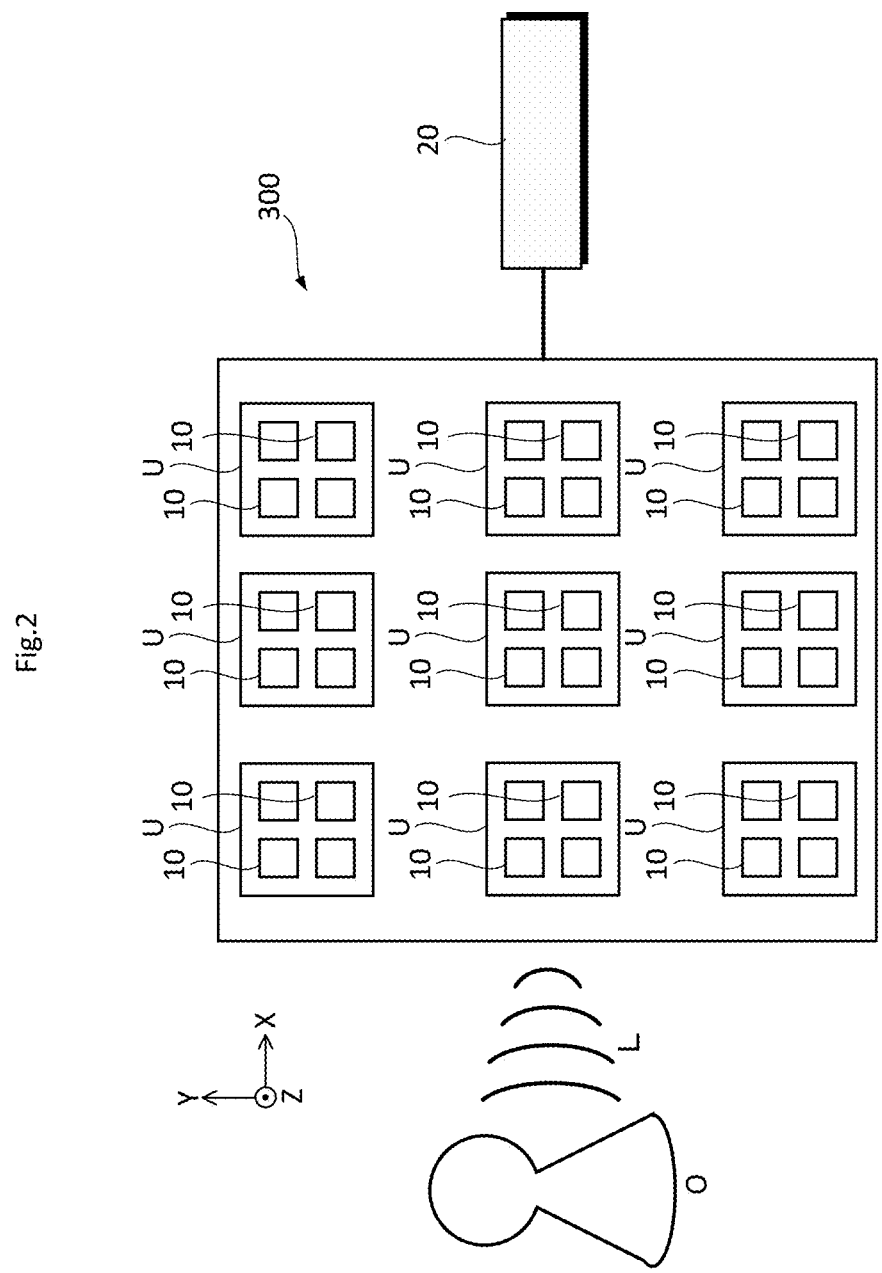
FIG. 2 is a configuration diagram illustrating an example according to an object detection apparatus according to the present invention.

FIG. 2 is a configuration diagram illustrating an example of an object detection apparatus 300 of the present invention. The object detection apparatus 300 is a detection device that detects the presence or movement of an object to be analyzed (hereinafter referred to as a "target object") O by detecting light L coming from the target object O. The target object O is, for example, an article, an animal, or a human.

An outline of the object detection apparatus 300 is as described below. As illustrated in FIG. 2, the object detection apparatus 300 includes a plurality of sensor units U and an analysis apparatus 20. The sensor unit U includes a plurality of (four in FIG. 2) photosensors 10 arranged on a single chip. For example, the photosensors 10 are arranged in an XY plane including an X direction and a Y direction orthogonal to the X direction. Note that a direction orthogonal to the XY plane is referred to as a Z direction.

The photosensor 10 is an optical sensor capable of detecting the light L incident from the target object O. Further, the photosensor 10 generates heat according to the amount of received light of the light L absorbed, and generates an electrical signal (hereinafter referred to as a "detection signal") according to the temperature of the generated heat.

The detection signal can also be rephrased as a signal representing a change in the light L coming from the target object O.

The light L detected by the photosensor 10 according to the present invention is, for example, ultraviolet light, visible light, or infrared light. Note that, in the present invention, an electromagnetic wave (thermal radiation) radiated according to the temperature of the target object O is also included as a kind of the light L.

The analysis apparatus 20 detects the presence or movement of the target object O by analyzing the detection signal generated by each photosensor 10 by any known technique.

<Photosensor>

Figure 3:
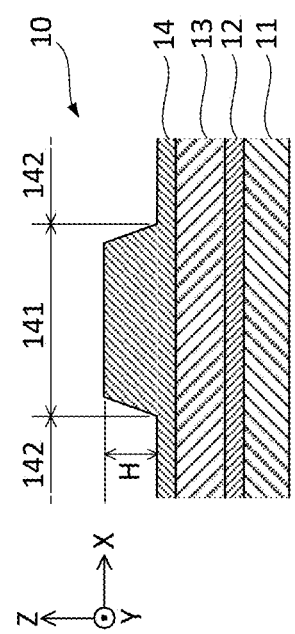
FIG. 3 is a cross-sectional diagram illustrating an example of the photosensor according to the present invention.

FIG. 3 is a diagram schematically illustrating a cross section of the photosensor 10. The photosensor 10 according to the present invention includes a plurality of stacked layers. In the photosensor 10, as illustrated in FIG. 3, a support substrate 11, a bottom electrode 12, a pyroelectric element 13, and an absorber 14 are stacked in this order.

The support substrate 11 is formed of, for example, an insulator such as SiNx. The bottom electrode 12 is formed on the upper surface of the support substrate 11. For example, it is formed of a material that reflects light (for example, Pt).

The pyroelectric element 13 (an example of the "means for detecting heat") is formed of, for example, a material (for example, ZnO or the like) capable of performing spontaneous polarization according to a change in temperature. The pyroelectric element 13 generates heat according to the light absorbed by the absorber 14. Further, the pyroelectric element 13 is spontaneously polarized according to the internal temperature, and a detection signal according to the temperature is generated.

The absorber 14 is formed on the upper surface of the pyroelectric element 13. The absorber 14 has, for example, the structure illustrated in FIG. 1, and absorbs light near this resonance wavelength by resonance as described above. Specifically, the absorber 14 is formed of metal or a dielectric. Note that the absorber 14 also functions as a top electrode. The metal forming the absorber 14 is, for example, Au, Ag, or Al. A dielectric forming the absorber 14 is, for example, Si, Ge, $Al_2O_3$, $TiO_2$, $SiO_2$, or SiC. Note that the absorber 14 may be formed of a plurality of materials. For example, the absorber 14 in which metal and a dielectric are combined may be adopted. However, it is sufficient if the surface of the absorber 14 is formed of at least one of metal and a dielectric.

As illustrated in FIG. 3, the surface of the absorber 14 includes a raised portion (hereinafter referred to as "raised portion") 141. Note that, in the description described below, a region other than the raised portion 141 on the surface of the absorber 14 is referred to as a "base portion 142" for the sake of convenience. In can be said that the portion protruding with respect to the surface of the base portion 142 is the raised portion 141. In the present invention, the surface of the absorber 14 includes a plurality of raised portions 141.

The absorber 14 according to the present invention absorbs light that is perpendicularly incident on the surface of the absorber 14 and has the same wavelength as the resonance wavelength of the absorber 14. For example, the absorber 14 can absorb 90% or more, preferably 95% or more, and more preferably 99% or more of light having the same wavelength as the resonance wavelength. Therefore, it can be said that the absorber 14 according to the present invention is a perfect absorber that substantially completely absorbs light.

In the present application, the "perpendicular direction" is, for example, the Z direction perpendicular to the XY plane. Note that, in practice, the photosensor 10 absorbs not only light incident only in the perpendicular direction but also light incident from the vicinity of the perpendicular direction including the perpendicular direction (within a range where the inclination angle is ±1° or less with respect to the perpendicular direction) at a high absorption rate. However, the photosensor 10 can absorb light incident from the perpendicular direction at the highest absorption rate.

FIG. 3 illustrates a thickness H (height in the Z direction) of the raised portion 141. In the present invention, when the thickness (height) of the raised portion 141 is not uniform, as will be described later, the thickness (height) at the thickest portion of the thickness of the raised portion 141 is defined as the thickness H of the raised portion.

The surface of the absorber 14 has a periodic structure in which a plurality of raised portions 141 is arranged at a predetermined period (hereinafter referred to as "unit period"). The periodic structure is a structure in which the plurality of raised portions 141 is arranged in a unit period so as to form a lattice pattern. That is, the plurality of raised portions 141 is positioned at intervals corresponding to the unit period.

Figure 4:
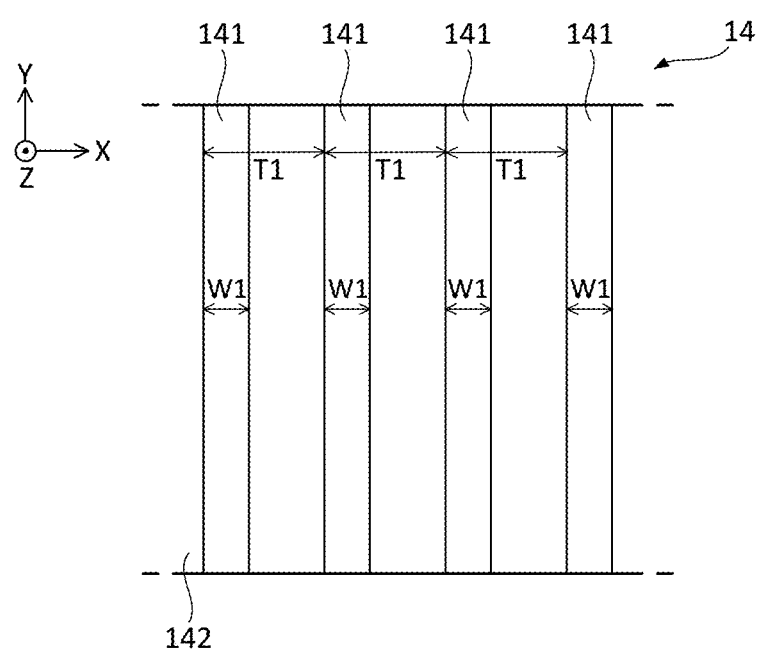
FIG. 4 is a plan view illustrating an example of a photosensor having a one-dimensional periodic structure.
Figure 5:
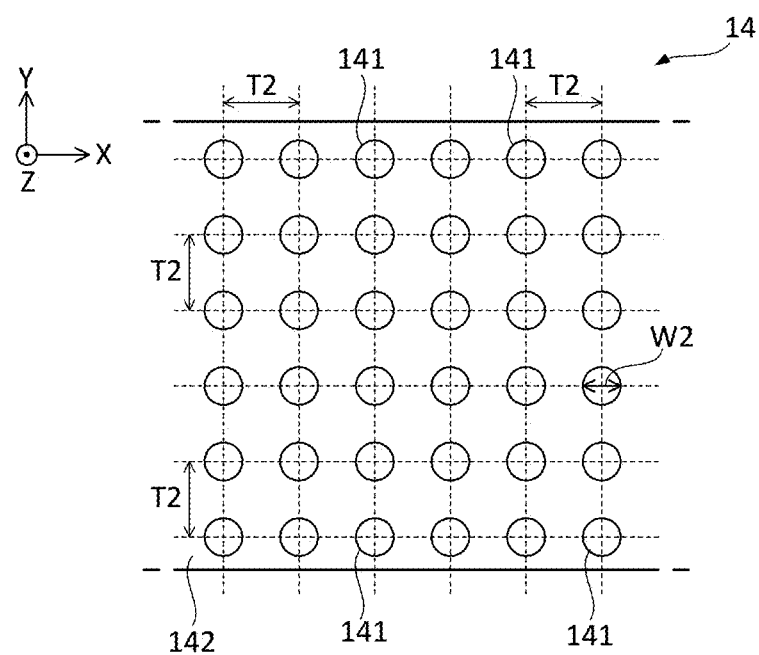
FIG. 5 is a plan view illustrating an example of a photosensor having a two-dimensional periodic structure.

In the present invention, a one-dimensional or two-dimensional lattice pattern is formed on the surface of the absorber 14. FIG. 4 is a plan view of the absorber 14 having a periodic structure according to a one-dimensional lattice pattern, and FIG. 5 is a plan view of the absorber 14 having a periodic structure according to a two-dimensional lattice pattern.

As illustrated in FIG. 4, in the one-dimensional lattice pattern, the raised portion 141 is formed in an elongated shape along the Y direction in plan view. Note that, in FIG. 4, the raised portion 141 formed in a rectangular shape is exemplified, but the shape of the raised portion 141 is arbitrary as long as it is an elongated shape. For example, the raised portion 141 may be elliptical. Note that, in the one-dimensional lattice pattern, the longitudinal direction of the raised portion 141 is the Y direction, and the lateral direction is the X direction.

The plurality of raised portions 141 is arranged so as to be parallel to each other along the X direction (example of the "predetermined direction"). Specifically, the plurality of raised portions 141 is arranged in a unit period T1 (example of the "first period"). That is, the two raised portions 141 adjacent to each other are periodically arranged at intervals corresponding to the unit period T1.

Specifically, the unit period T1 is a movement distance when one of the two raised portions 141 adjacent to each other is translated so as to completely overlap the other. The unit period T1 is, for example, 0.2 μm to 25 μm, and preferably 3.0 μm to 14.0 μm.

In the one-dimensional lattice pattern, a width W1 of the raised portion 141 is 0.3 to 0.7 times the unit period T1. The exact definition of the width W1 of the raised portion 141 will be described later. When the width W1 is within the above range, it is possible to absorb light incident from the direction perpendicular to the surface of the photosensor 10 at a very high absorption rate. Note that, from the viewpoint of making this effect more remarkable, W1 is preferably 0.3 to 0.7 times the unit period T1. The width W1 is, for example, 0.1 μm to 17.0 μm, preferably 0.9 μm to 10.0 μm.

In the one-dimensional lattice pattern, the thickness H of the raised portion 141 is 0.05 to 0.2 times the unit period T1. When the thickness H is within the above range, the directivity, the sensitivity, and the wavelength resolution can be improved. Note that, from the viewpoint of making this effect more remarkable, the thickness H is preferably 0.05 to 0.2 times the unit period T1. The thickness H is, for example, 0.01 μm to 5.0 μm, preferably 0.15 μm to 3.0 μm.

As illustrated in FIG. 5, in the two-dimensional lattice pattern, for example, the raised portion 141 is formed in a circular shape in plan view. Note that, in FIG. 5, the raised portion 141 formed in a circular shape is exemplified, but the shape of the raised portion 141 is arbitrary. For example, the raised portion 141 may be formed in a regular polygonal shape.

In the two-dimensional lattice pattern, the plurality of raised portions 141 is arranged such that a unit lattice (in the present specification, a square lattice or a regular triangular lattice will be mainly described, but in general, any lattice having a periodic structure may be used) having a predetermined shape is repeated. That is, the unit lattice is a minimum unit of the lattice pattern. FIG. 5 illustrates a case where the raised portions 141 are arranged in a square lattice shape.

The plurality of raised portions 141 is arranged in a unit period T2 (example of the "second period"). That is, the two raised portions adjacent to each other are periodically arranged at intervals corresponding to the unit period T2. Here, since it is a two-dimensional periodic structure, a unit period of repetition in two directions: the X direction and the Y direction (the length of the period is T2 in both directions) is illustrated. Note that, needless to say, since FIG. 5 is a square lattice, these two repeating directions (the X direction and the Y direction) are orthogonal to each other, and the size of the unit period T2 is also illustrated as the lengths in the X direction and the Y direction. However, it should be noted that, in other types of lattices, the repeating directions in the two-dimensional periodic structure are not necessarily orthogonal to each other. As understood from the above description, the plurality of raised portions 141 is arranged in the second period T2 so as to have a lattice shape such as a square lattice shape or a regular triangular lattice shape.

Specifically, the unit period T2 is a movement distance when one of the two raised portions 141 adjacent to each other is translated so as to completely overlap the other. The unit period T2 is, for example, 0.2 μm to 25 μm, and preferably 3.0 μm to 14.0 μm.

In the two-dimensional lattice pattern, a width W2 of the raised portion 141 is 0.3 to 0.7 times the unit period T2. A strict definition of the width W2 of the raised portion 141 will be described later including a case where the shape of the raised portion 141 is a general figure that is not necessarily rotationally symmetric. When the width W2 is within the above range, it is possible to absorb only light incident from the perpendicular direction. Note that, from the viewpoint of making this effect more remarkable, the width W2 is preferably 0.3 to 0.7 times the unit period T2. The width W2 is, for example, 0.1 μm to 17.0 μm, preferably 0.9 μm to 10.0 μm.

In the two-dimensional lattice pattern, the thickness H of the raised portion 141 is 0.05 to 0.2 times the unit period T2. When the thickness H is within the above range, the directivity, the sensitivity, and the wavelength resolution can be improved. Note that, from the viewpoint of making this effect more remarkable, the thickness H is preferably 0.05 to 0.02 times the unit period T2. The thickness H is, for example, 0.01 μm to 5.0 μm, preferably 0.15 μm to 3.0 μm.

Note that, in the two-dimensional lattice pattern, the planar shape of the raised portion 141 is arbitrary as long as the raised portion 141 is formed in the unit period T2 and formed in a lattice shape.

In the present invention, at least one photosensor 10 of the plurality of photosensors 10 in one sensor unit U may have a unit period different from that of the other photosensors 10. For example, when the unit period becomes relatively large, the wavelength range of the absorbed light shifts to the long wavelength side, and when the unit period becomes relatively small, the wavelength of the absorbed light shifts to the short wavelength side. That is, at least one photosensor 10 of the plurality of photosensors 10 can have a detection wavelength different from that of the other photosensors 10. Note that the unit periods of all the photosensors 10 in the sensor unit U may be different.

Figure 1:
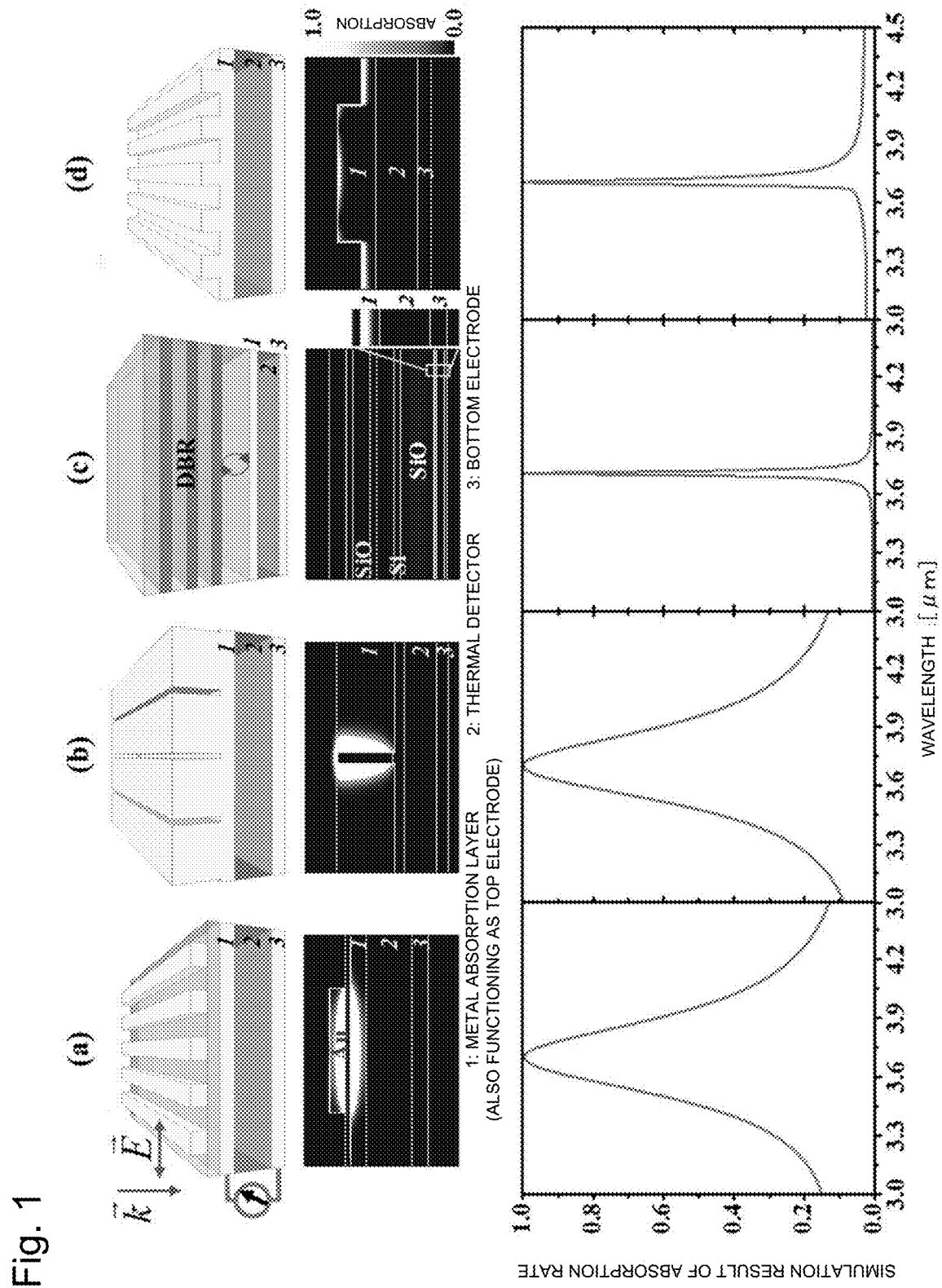
FIG. 1(*a*) is a schematic diagram of a perfect absorber using surface plasmon resonance according to a metal-insulator-metal (MIM) structure. A strip-shaped metal structure having a finite width as the fifth layer from the upper side becomes a resonator that confines localized surface plasmons, and the resonance wavelength changes depending on the size of the width of the strip. The Q factor is around 10. (b) A schematic diagram of a perfect absorber using resonator effect of surface plasmon in the longitudinal direction of a groove surface. The deeper the groove, the longer the wavelength resonance. The Q factor and the directivity are similar to those in (a). (c) A schematic diagram of a perfect absorber in which a dielectric resonator is sandwiched between a distributed reflector and a metal total reflector. Resonant light causes internal multiple reflection, and absorption is repeated due to loss at the time of reflection on the surface of the metal total reflector, so that light is attenuated and perfect absorption is realized. (d) A schematic diagram of a light absorber used by the photosensor of the present invention.

In the present invention, there is provided a photosensor in which a wavelength selective perfect absorber having a basic structure having a periodic structure as illustrated in FIG. 1(*d*) is adopted.

The wavelength selection element constituting the sensor includes a perfect absorber in which a simple periodic structure is formed on a metal or dielectric surface. Note that the periodic structure (one-dimensional lattice pattern) illustrated in FIG. 1 is obtained by arranging linearly extending raised portions in parallel. However, as already described with respect to FIGS. 6(*a*) and 6(*b*), a periodic structure of a two-dimensional lattice pattern can be taken. Note that FIGS. 6(*a*) and 6(*b*) will be described later. In the description described below, the one-dimensional lattice pattern may be referred to as a "one-dimensional lattice", and the two-dimensional lattice pattern may be referred to as a "two-dimensional lattice". Here, specifically, the periodic structure is a periodic arrangement of raised structures (circular or polygonal in plan view) formed of the metal on the metal surface or formed of the dielectric on the dielectric surface, and the structures are arranged in a lattice shape. Here, the minimum unit of the lattice is referred to as a unit lattice. In addition, in the case of configuring a photosensor that does not perform polarization detection, the shape of the raised structure in each unit lattice is, for example, a regular n-sided polygon in plan view. The lattice is, for example, a square lattice or a regular triangular lattice among two-dimensional lattices. The shape of the raised portion is desirably matched with the lattice. That is, the rotational symmetry of the lattice is 4-fold symmetry (¼ rotation, that is, rotation of (360/4)° matches the original lattice and so on) in the case of the square lattice, and is 3-fold symmetry in the case of the regular triangular lattice. However, for each of the square lattice and the regular triangular lattice, the raised portion in the unit lattice is desirably respectively 4 m-fold and 3 m-fold symmetries (m is a natural number). For example, in the case of the square lattice, the shape of the raised portion is desirably a square, a regular octagon, or the like, and in the case of the regular triangular lattice, the shape of the raised portion is desirably a regular triangle, a regular hexagon, a regular dodecagon, or the like. When matching is not achieved, the half width of the absorption spectrum is widened, and the background (absorption at a wavelength greatly deviated from the center wavelength) is increased. In addition, perfect absorption is also impaired. Further, it is desirable that raised portions in the lattice be identical in size and shape to one another. If the size and shape of raised structure portions are different, the characteristics of the perfect absorber described below deteriorate. Note that, here, when the raised portion is circular (disk-shaped), the circle has rotational symmetry for any number of rotations. Therefore, it should be noted that the raised portion in the circular unit lattice can be used in either a square lattice or a regular triangular lattice. Note that, as described below, it should be noted that the above conditions do not necessarily have to be strictly followed depending on the characteristics required for the photosensor or it is possible to intentionally deviate from these conditions.

In order for the photosensor of the present invention to have polarization dependency (that is, high selectivity for light in a specific change direction), it is sufficient if the lattice is a one-dimensional lattice. Alternatively, it is sufficient if the two-dimensional lattice has anisotropy or the shape of the raised portion in the unit lattice in the two-dimensional lattice has anisotropy. Specifically, the one-dimensional lattice means a case where raised portions extending linearly in a specific direction as illustrated in FIG. 1(*d*) are arranged in parallel and at equal intervals. In order for the two-dimensional lattice to have anisotropy, a rhombic lattice, a rectangular lattice, or a parallel lattice obtained by performing affine transformation (that is, projective transformation that maintains parallel lines in parallel) such as stretching a square lattice and a regular triangular lattice having the above-described n-fold symmetry (n≥3) in a specific direction is used. In order for the shape of the raised portion in the unit lattice in the two-dimensional lattice to have anisotropy, for example, it is sufficient if an elliptical raised portion obtained by stretching a circular raised portion in a specific direction (one in which the n-fold symmetry (n≥3) is lost) is used. The elliptical shape has two-fold symmetry, but three or more symmetries of the original circle are lost.

In addition, the material that can be used as the metal or the dielectric is, for example, Au, Ag, Al, Si, Ge, $Al_2O_3$, $TiO_2$, $SiO_2$, or SiC. However, the materials of the metal and the dielectric are not limited to the above examples. The wavelength selection element formed of the perfect absorber according to the present invention resonantly absorbs only light having a desired wavelength within light incident within a range of an angle inclined by about 1° from the perpendicular direction at a resolution of a Q factor of 50 or more, and emits heat. The heat generated on the surface of the perfect absorber is conducted to the back side of the absorber by heat conduction, and is detected by a thermal detector disposed immediately below. Further, the heat is converted into electricity in the thermal detector, and the electricity is detected.

Note that, in the present application, a concept "perfect absorber" is used, but it should be noted that the term "perfect absorption" herein does not mean logically all, that is, it is not limited to one that truly absorbs 100%. Since the sensor provided in the present invention is a physical entity, it is usually rare to absorb 100% of light in the elements constituting it, and only about 99% is absorbed in the examples and simulations described below, but this also operates substantially in the same manner as in a case of using an element that truly absorbs 100%. What degree of absorption rate can be regarded as the "perfect absorber" in the sense of the essence of the present invention varies depending on various conditions, but, for example, an absorption rate of 90% or more, preferably 95% or more, and more preferably 99% or more can be regarded as the "perfect absorber".

Figure 6:
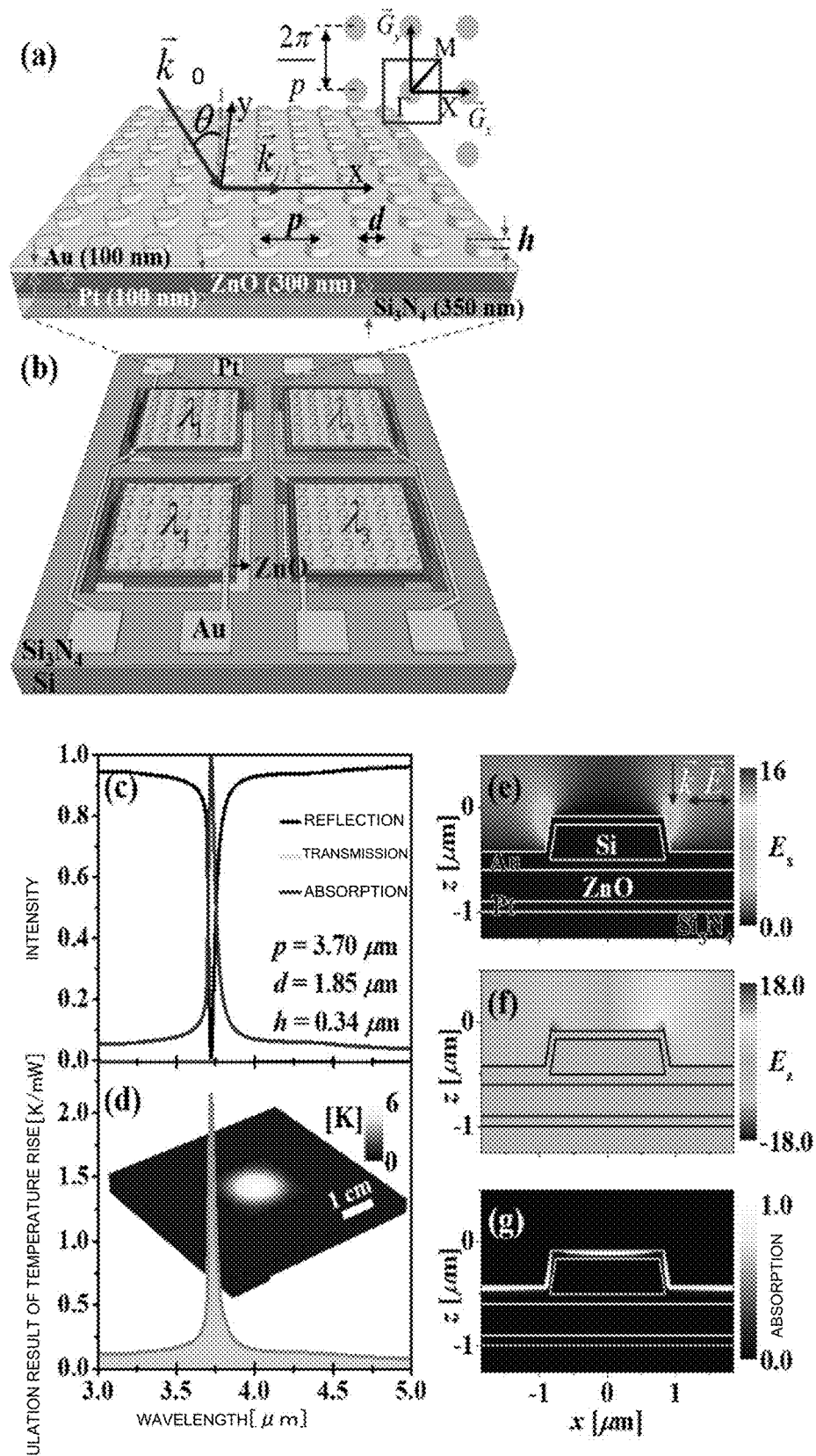
FIGS. 6(*a*) and 6(*b*) are schematic diagrams explaining a design of a sensor in the present invention. (a) illustrates a pyroelectric light detection element for one wavelength, and this element is manufactured in an area of 2 mm×2 mm. In each element, disk-shaped plate-shaped bodies (more generally, circular or regular polygonal raised portions) made of metal or the like are arranged in a lattice shape on a metal (which may be a dielectric) film formed on its surface. (b) is a schematic diagram of a four-wavelength type on-chip sensor in which light detection elements for four wavelengths are manufactured in an area of 1 cm×1 cm. (c): Light reflection spectrum and absorption spectrum of the element for one wavelength. (d): A diagram illustrating results of simulation of temperature distribution and wavelength dependency of temperature rise in one wavelength element. (e), (f), and (g) are results of an electromagnetic field simulation of a perfect absorber.

FIGS. 6(*a*) and 6(*b*) are schematic diagrams explaining an example of a design of the photosensor according to the present invention. (a) illustrates a pyroelectric light detection element for one wavelength (also referred to as a single wavelength sensor), and this element is manufactured in an area of 2 mm×2 mm. FIG. 6(*b*) illustrates a four-wavelength type on-chip sensor in which such light detection elements for four wavelengths are manufactured in an area of 1 cm×1 cm. FIG. 6(*c*) illustrates a light reflection spectrum and an absorption spectrum of the element for one wavelength. In addition, FIG. 6(d) illustrates a result of simulation of the temperature distribution and the wavelength dependency of the temperature rise in the element for one wavelength element, that is, in the single wavelength sensor.

Note that throughout the specification of the present application, simulation was performed as described below. Optical spectra (transmissibility, reflectance, and absorption rate) were simulated using the RCWA method (using DiffractMOD from RSoft Design Inc.). Full-wave simulation (using FullWAVE from RSoft Design Inc.) based on the FDTD method was adopted for the electric field and absorption distribution. In both simulations of the RCWA method and the FDTD method, it is assumed that the excitation electromagnetic field propagates in a–z-axis direction and the electric field vibrates in an x-axis direction, and the intensity of the incident field and the phase thereof are normalized to 1. In the electromagnetic simulation, the dielectric function of Au, Si, and $SiO_2$ described in Non-Patent Literature 8, and the dielectric function of ZnO described in Non-Patent Literature 4 were used. In addition, regarding $Si_3N_4$, it was obtained by spectroscopic ellipsometry measurement.

The multi-wavelength sensor is obtained by integrating the single wavelength sensor according to the present invention, that is, the photosensor element for one wavelength on a chip, and the relationship between the structure of the perfect absorber and the resonance wavelength in this single wavelength sensor will be described below.

When the sum of the surface parallel component of the momentum of the incident light and the reciprocal lattice (momentum) of the diffraction grating matches with the momentum of the surface plasmon polariton propagating over the surface, the absorption of the incident light from the diffraction direction increases. In the perfect absorber used in the photosensor according to the present invention, this effect is utilized.

$$|\vec{k}_{spp}| \qquad \text{[Math. 1]}$$

The absolute value of the wavenumber of the surface plasmon polariton propagating over the element surface $$k_0 = \frac{2\pi}{\lambda} \qquad \text{[Math. 2]}$$

is the absolute value of the momentum of the incident light, and when $\varepsilon_m$ is the complex dielectric constant of the metal or dielectric forming the periodic structure element, the relational expression described below holds with respect to the surface plasmon polariton excited on the element surface.

[Math. 3]

$$|\vec{k}_{spp}| = k_0 \sqrt{\frac{\varepsilon_m}{\varepsilon_m + 1}}, \qquad (2)$$

At this time, the momentum of the surface plasmon polariton $$|\vec{k}_{spp}|, \qquad \text{[Math. 4]}$$

The surface parallel component of the momentum of the incident light $$\vec{k}_\parallel, \qquad \text{[Math. 5]}$$

Basic reciprocal lattice vector of a surface lattice, which is a lattice formed on the absorber surface by the periodic structure defined above $$\vec{G}_x, \vec{G}_y \qquad \text{[Math. 6]}$$

When the momentum conservation relationship described below holds during the above, the surface plasmon polaritons are excited and the light is efficiently absorbed.

[Math. 7]

$$\vec{k}_{spp} = \vec{k}_\parallel + i\vec{G}_x + j\vec{G}_y \qquad (3)$$

Where θ is an angle from the direction perpendicular to the surface, $$|\vec{k}_\parallel| = k_0 \sin\theta \qquad \text{[Math. 8]}$$

the magnitude of projection of the momentum vector of the incident light in the surface parallel direction. Here, i and j are integers. The vector $$\vec{k}_\parallel \qquad \text{[Math. 9]}$$

is $$\vec{G}_x \qquad \text{[Math. 10]}$$

the direction (Γ–X direction in FIG. 6(a)), Equation (3) can be written as described below.

[Math. 11]

$$|\vec{k}_{spp}|^2 = |(\vec{k}_\parallel + i\vec{G}_x) + j\vec{G}_y|^2 = (k_0 \sin\theta + iG_x)^2 + (jG_y)^2 \qquad (4)$$

In Equations (2) and (4), $$|\vec{G}_x| = |\vec{G}_y| = \frac{2\pi}{p}, k_0 = \frac{2\pi}{\lambda}, \qquad \text{[Math. 12]}$$

The dispersion relation of the surface polariton in the Γ–X direction can be written as described below.

[Math. 13]

$$\frac{\varepsilon_m}{\varepsilon_m + 1} = \sin^2\theta + \left(\frac{2i}{p}\sin\theta\right)\lambda + \left(\frac{i^2 + j^2}{p^2}\right)\lambda^2. \qquad (5)$$

In this equation, in the case of perpendicular incidence, the wavelength calculated as described below.

$$\lambda = \frac{p}{\sqrt{i^2 + j^2}} \sqrt{\frac{\varepsilon_m}{\varepsilon_m + 1}} \qquad \text{[Math. 14]}$$

Figure 7:
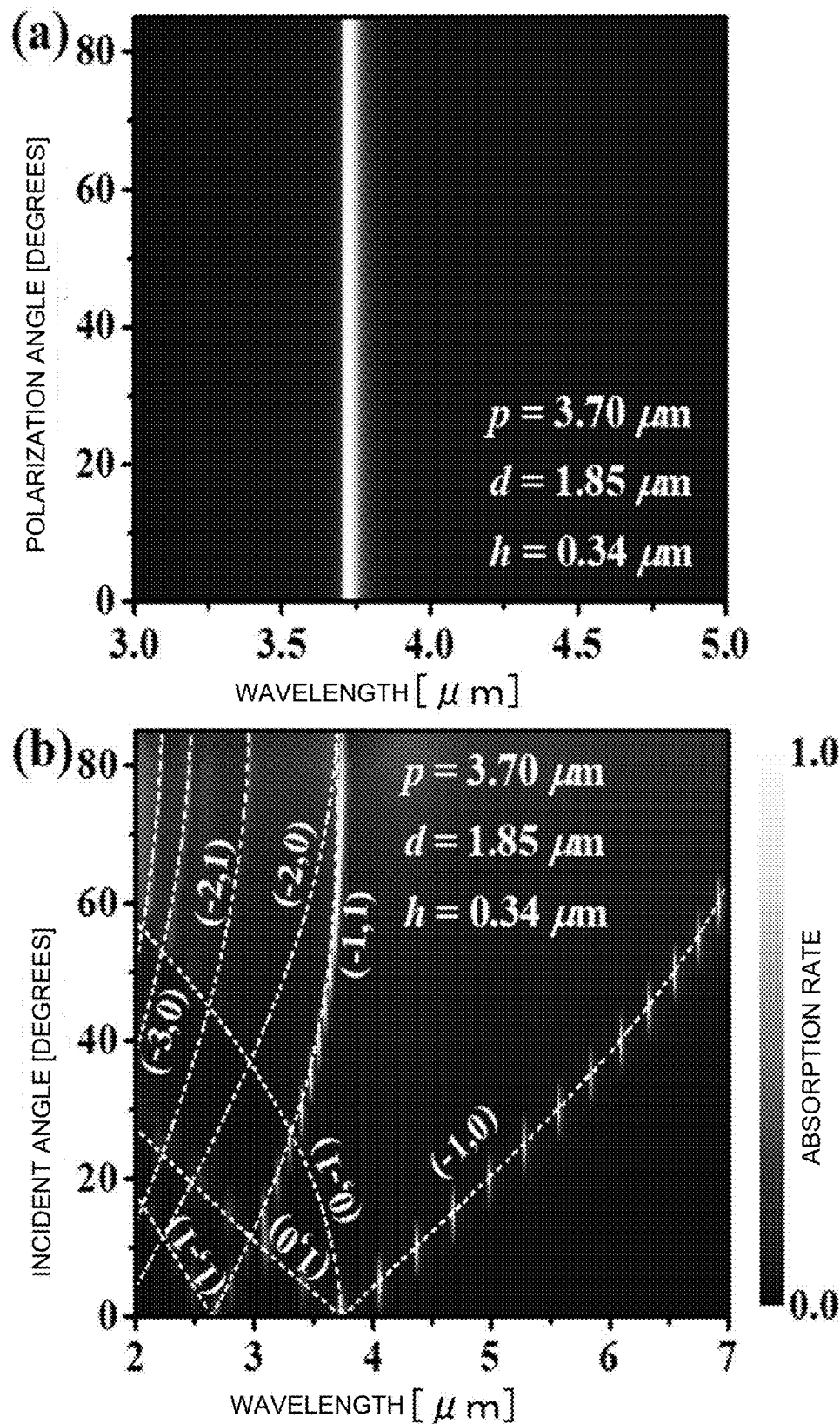
FIG. 7(*a*) is a diagram illustrating dependency of absorption intensity with respect to polarization of incident light. (b) A diagram illustrating angular dependency of resonance wavelength for some i's and j's. In the case of a two-dimensional square lattice, polarization dependency is not shown. A photosensor having high directivity in the perpendicular incident direction becomes possible from steep angular dependency as described in (b).

That is, in the case of perpendicular incidence, the magnitude of the resonance wavelength is determined by the period p of the surface lattice and the integers i and j. FIG. 7 illustrates (a) dependency of absorption with respect to polarization of incident light and (b) angular dependency of a resonance wavelength with respect to some i's and j's. In this design example, since the raised portion in the unit lattice is circular and the periodic structure is also a square lattice, the structure has no anisotropy and does not show polarization dependency. Note that, as described above, by introducing anisotropy into the shape and the periodic structure of the raised portion in the unit lattice, it is possible to impart polarization dependency, that is, a characteristic of strongly absorbing not only the wavelength but also incident light in a specific polarization direction. In addition, it is strongly reflected that it is the diffraction effect of the periodic structure, and the resonance wavelength shows clear angular dependency as illustrated in FIG. 7(b). In this design, at an incident angle of 0°, some branches appearing in the range of 3.0 to 5.0 μm degenerate, and only wavelengths around 2.6 μm and 3.7 μm show perfect absorption. As a result, the resonance mode of 3.7 μm shows angular dependency that changes steeply at 0°, and by using this, a sensor with high directivity becomes possible. That is, when there is degeneracy, a strong absorption peak (strong detection output peak in terms of sensor output) appears near an incident angle of 0 degrees, but even if the incident angle is slightly deviated, the intensity is steeply decreased due to the splitting effect into three diffraction modes (in FIG. 7(b), see incident angle=0 degree and the degeneracy of three modes to wavelength of 3.7 μm) at the time of the angle deviation, that is, an effect of obtaining an extremely high incident angle direction selectivity, in other words, the directivity can be obtained. This effect is obtained from the fact that degeneracy has occurred (in a degenerate state) as described above.

As a result, since the present invention takes advantage of the excitation of "surface plasmon polariton (SPP) via a light diffraction phenomenon" (Wood's Anomaly: Wood's anomalous diffraction) in which absorption occurs only in a direction in which light diffraction occurs, the angular resolution can be significantly increased. In addition, since the SPP modes here exhibits degeneracy at zero degrees, the angular resolution (directivity) in the vicinity of zero degrees is particularly high. Note that the reason why absorption occurs only in the direction in which diffraction occurs can also be described that the SPP is excited by receiving a momentum corresponding to a reciprocal lattice vector from the lattice.

Here, the above-described degeneracy will be described in more detail. In FIG. 7(b), the reason why triple-degeneracy occurs at an incident angle of 0 degrees is that, in Formula (5), θ is 0 because the incident angle=0 degrees, that is, perpendicular incidence, and thus, the formula described after Formula (5) is obtained. In this formula, four modes of $i^2+j^2=1$ take the same energy, and all degenerate at an angle of 0. Note that, here, since a beam is put in parallel to the x axis and is a reflection target with respect to x, the two modes (0,1) and (0,−1) of the four modes are equal and overlap, and thus, in FIG. 7(b), three beams are seen. That is, what has been referred to as "three modes" above is, strictly speaking, four modes including the completely overlapping modes.

When the mode degenerate at the angle of zero is not used as the mode of perfect absorption, the angular resolution cannot be increased. On the other hand, even in a case where the degenerate mode is used as the mode of perfect absorption, when unnecessary sub-peaks caused by the localized mode of the surface plasmon on the surface of the raised portion in the unit lattice coexist and overlap, since the sub-peaks have low directivity, high directivity of the degenerate mode cannot be utilized, and wavelength selectivity is also impaired.

Although an infrared sensor having a periodic structure has been proposed in the past (Non-Patent Literature 1 to 3), consideration is not given to the momentum conservation by the momentum of three of the surface plasmon polariton, the surface parallel component of the incident light, and the diffraction grating, and the degeneration of each resonance mode at an incident angle of 0 degrees. In addition, in the spectrum, important performance such as narrowband, perfect absorption, and low background cannot be realized. In addition, the angular resolution and the directivity are also low. The reason for this is that the resonator effect of localized surface plasmons and the resonance of the diffraction grating and the surface plasmon polariton optimized in the present invention cannot be well separated, but are mixed, resulting in a broad or complex absorption spectrum with many sub-peaks.

Therefore, in the present application, it has been found that degeneracy can be indirectly controlled by performing optimization as described below.

(1) The height and diameter of the disk (generally the raised portion in the unit lattice) are adjusted to be as large as possible so that the perfect absorption at an incident angle of 0 degrees approaches 100%.

(2) On the other hand, in order to prevent an unnecessary peak of localized surface plasmon from appearing in the spectrum, the height and diameter of the disk are not made too large.

To describe what (2) above means, the present invention can be regarded as "an excitation phenomenon of a surface plasmon polariton via a diffraction phenomenon" in the first place. This is different from the resonance due to the confinement effect of the "localized surface plasmon" in a finite size object illustrated in FIGS. 1(a) and 1(b). As the disk becomes higher and larger, it not only exhibits purely a diffraction grating role, but in turn each disk becomes an object that also acts independently as a resonator. In such a case, in the example described here, the surface plasmon confined in the disk starts to appear as a broad background having a structure in the vicinity of 4 to 6 μm as a mode of "localized surface plasmon". The size of the disk is about 2 to 3 μm smaller than the period, but the resonance wavelength of the confined mode is considered to appear at about 4 to 6 μm longer than that.

Here, the "localized surface plasmon" has a large half width as shown in the graphs of the simulation results of the absorption rate illustrated in the lower parts of FIGS. 1(a) and 1(b), and is not preferable for the sensor. FIG. 1(a) illustrates a confinement mode in the lateral direction, and FIG. 1(b) illustrates a confinement mode in the longitudinal direction. Note that it is considered that when the disk diameter becomes too large, the feature of the structure transitions to the groove structure as illustrated in FIG. 1(b), and not only the lateral mode but also the longitudinal confinement mode occurs, and the spectrum becomes more complicated.

In a case where an optical filter is designed and created without noticing the difference between the above two resonances, the mode of the "localized surface plasmon" cannot be suppressed, and thus there is only an unpreferable characteristic that an unnecessary peak or background appears in the spectrum.

Supplementing the above description regarding (1) above, when the disk diameter and height are too small, the diffraction effect becomes small and perfect absorption cannot be achieved, but conversely, when the disk diameter and height are too large, behavior as a lone resonator rather than a diffraction grating appears, and there is a problem that a clear spectrum is not obtained. In the present application, an optimum structure is obtained in consideration of this point. In the present invention, an array of disks (raised portions) as protrusions is formed on the surface of the photosensor, and the height and diameter of the protrusions are adjusted so as to suppress the appearance of absorption due to the generation of localized surface plasmons and to promote the diffraction effect of the surface plasmon polariton to cause perfect absorption. Thus, by avoiding the appearance of absorption due to localized surface plasmon (LSPR) as much as possible and making the most of the excitation of the surface plasmon polariton (SPP) due to the diffraction phenomenon, the directivity and the wavelength resolution of the element can be enhanced.

Note that, as described above, the shape of the raised portion in the unit lattice, which is a unit of symmetry of the lattice, is not limited to a circular shape, but a regular polygon having rotational symmetry can also be used. In addition, this lattice can use not only a square lattice but also a regular triangular lattice. In addition, the shape of the raised portion in the unit lattice is preferably matched with the symmetry of the lattice having the unit lattice as a minimum unit as described above. Specifically, in the case of a square lattice, it is preferable to use a raised portion having a square shape, a regular octagonal shape, or the like, and in the case of a regular triangular lattice, it is preferable to use a raised portion having a regular triangular shape, a regular hexagonal shape, a regular dodecagonal shape, or the like.

In addition, in order for the photosensor of the present invention to have polarization dependency, that is, to respond to light in a specific polarization direction, it is generally sufficient if the raised portion in the lattice and/or the unit lattice has anisotropy. However, as the simplest configuration, it is sufficient if a one-dimensional lattice is used instead of using a two-dimensional lattice as illustrated in FIG. 6(c). More specifically, as illustrated in FIG. 1(d), it is sufficient if linear and strip-shaped raised portions extending in a specific direction are arranged in parallel with each other at equal intervals, that is, in a one-dimensional lattice shape.

Note that, although the above is the description of the case of having a metal structure, an element having a similar function is possible even when the constituent material is a dielectric and a surface phonon polariton is used instead of the surface plasmon polariton. In addition, in the case of not only a circular shape, but also a polygonal shape such as a square or a hexagon, not only a square lattice, but also a regular triangular lattice, and further a sensor that detects light in a specific changing direction, an element having a similar function is possible even when a one-dimensional lattice is used.

Here, attention is paid to the resonance wavelength (that is, perfect absorption occurs, and the wavelength of light detected by the photosensor). In the specification of the present application, description is mainly given of light in a medium wavelength infrared region, but as is clear from the theoretical description given above, the resonance wavelength does not need to be limited to this region, and a sensor that operates for light in a wide range including ultraviolet rays, visible rays, and various infrared rays can be configured.

(e), (f), and (g) of FIG. 6 illustrate results of electromagnetic field simulation. With respect to the incidence of light from the −z direction, it can be seen from FIG. 6(e) that enhancement of the x-direction component of the electric field occurs at the end of the disk structure. More specifically, in a sidewall portion of the disk structure, an Ex direction component of the electric field has a value of about 12 on the scale illustrated on the right side of the drawing, but this value decreases as it goes farther. In addition, from FIG. 6(f), it can be seen that the phase of the electric field in the z direction is reversed at the left end and the right end of the disk (values of about −18 and 18, respectively, on the scale on the right side of the drawing), and propagation-type surface plasmon polaritons are excited. From FIG. 6(g), it can be seen that light absorption occurs on the upper surface of the perfect absorption structure of Au. FIG. 6 (d) illustrates that when infrared light having a resonance wavelength of 1 mW is emitted in a range of a radius of 0.5 mm, a temperature rise of 2.3 K occurs in the pyroelectric element sensor portion, and it is found that the infrared sensor has sufficiently high responsiveness. Note that, in a case where a plurality of photosensors according to the present invention is integrated on one chip to constitute a multi-wavelength photosensor, in order to minimize the influence of heat from adjacent photosensors, a thermal barrier made of a constituent element having high thermal resistance, e.g., a substance having high thermal resistance, or reducing heat propagation by a slit or a notch can be installed between photosensors on the chip.

Figure 8:
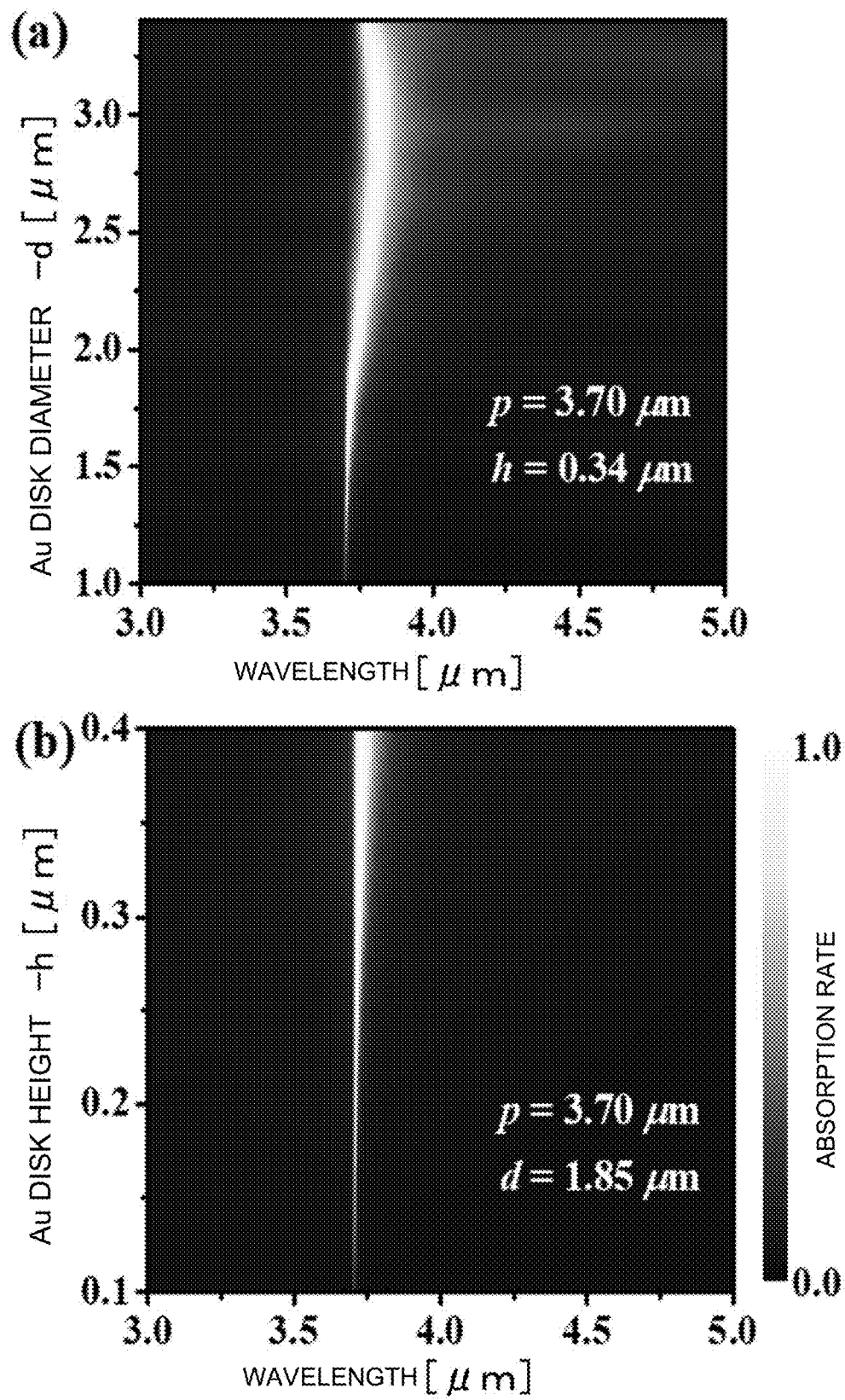
FIG. 8 is a diagram illustrating dependency of light absorption intensity of an element with respect to (a) a diameter and (b) a height of a unit lattice disk, which is a minimum unit of a lattice. Based on this result, the values of the disk height and diameter are determined, and the absorption rate and the wavelength resolution are optimized.

As described above, since the wavelength selection element used in the photosensor according to the present invention uses the coupling effect between the diffraction grating and the propagation-type surface plasmon polariton, it is possible to realize narrowband perfect absorption indicating a Q factor of 50 or more unlike the elements as illustrated in FIGS. 1(a) and 1(b) using the confinement-type localized surface plasmon. In addition, the acceptance angle of light can also be increased utilizing the high angular dependency that this phenomenon shows as a diffraction phenomenon. The intensity of absorption of this element depends on the radius and height of the structure in the unit lattice, for example, the disk structure in the case of FIG. 6(a). This is illustrated in FIG. 8. FIG. 8(a) illustrates the dependency of the intensity of the spectrum with respect to the diameter of the Au disk structure and FIG. 8(b) illustrates the dependency of the intensity of the spectrum with respect to the height of the disk structure. Based on this result, the values of the disk height and diameter were determined, and the absorption rate and the wavelength resolution were optimized. Note that, in FIG. 8, the optimum diameter of the disk was around 50% of the period p (0.3p to 0.7p), and the optimum height of the disk was in the range of 0.05 to 0.2p. Here, the range of the optimum diameter (or the size of the portion corresponding to it) of the raised portion, which is a more generalized version of the disk, is the diameter of the circumscribed circle when the raised portion is a regular polygon. In addition, in a case where the raised portion has an elongated shape, that is, an elliptical shape or an elongated polygonal shape so that the polarization direction can also be detected, or in a case where the width of the raised portion having another planar shape is considered, as the width of the raised portion in the remaining direction, the length of a line segment formed by an orthogonal projection of the raised portion on a straight line in the direction is set as the width. Since the width varies depending on the direction, the maximum value and the minimum value at the time of the width when the direction is changed are referred to as the width of the widest portion and the width of the narrowest portion, respectively. Therefore, in the case of considering the general shape of the raised portion which may be a general two-dimensional figure, e.g., elongate, it is optimal that the width of the narrowest portion of such a raised portion is 0.3p or more and the width of the widest portion is 0.7p or less. In addition, regarding the shape in which the width of the widest portion and the width of the narrowest portion do not match, when simply referring to the value range of the width without specifying which width, it means "regarding a value of any width between the maximum and the minimum". That is, the "width" of the raised portion is a distance between two parallel straight lines that are in contact with the peripheral edge of the raised portion and sandwich the raised portion in plan view, and it is sufficient if the distance is within a range of 0.3 to 0.7 times the period. Note that a plurality of distances (that is, "widths") conceived by the two parallel straight lines can exist according to the planar shape of the raised portion.

In the case of a one-dimensional structure in which the raised portion extends in one direction such as a rectangular shape, it is optimal that the size in the direction orthogonal to the longitudinal direction, that is, the so-called width is 0.3p to 0.7p. In addition, the height of the raised portion is optimally within a range of 0.05p to 0.2p regardless of the planar shape thereof. Note that FIG. 8 is a diagram of an Au disk, but the optimum conditions shown for the case of the Au is applied to the size of the raised portion made of other metals such as Al, Ag, and Cu or alloys. Furthermore, even in a case where the raised portion such as a disk is made of a dielectric, the above optimum conditions for size can be applied as they are. Here, surface standing waves occur within their "width". FIG. 6(*c*) is a result of a simulation of a structure in which disks having a diameter of 1.85 μm and a disk height of 0.34 μm are arranged at a period of 3.7 μm. When this structure is practically manufactured, the periodic surface structure may be composed of only metal, or a surface structure of Si or the like may be etched and an Au film of about 100 nm may be conformally formed thereon to maintain the base shape. This is because most of induced charges and polarization due to the incident light are generated on the upper side of the metal periodic structure (see FIG. 6(*g*)), and there is almost no difference even when the inside is Si. In general, when the thickness of the film of Au or other metals on the surface is about 50 nm or more, light cannot reach the back side of such a film, and thus the influence of a material or the like at a position 50 nm or more deep from the surface can be ignored.

Figure 11:
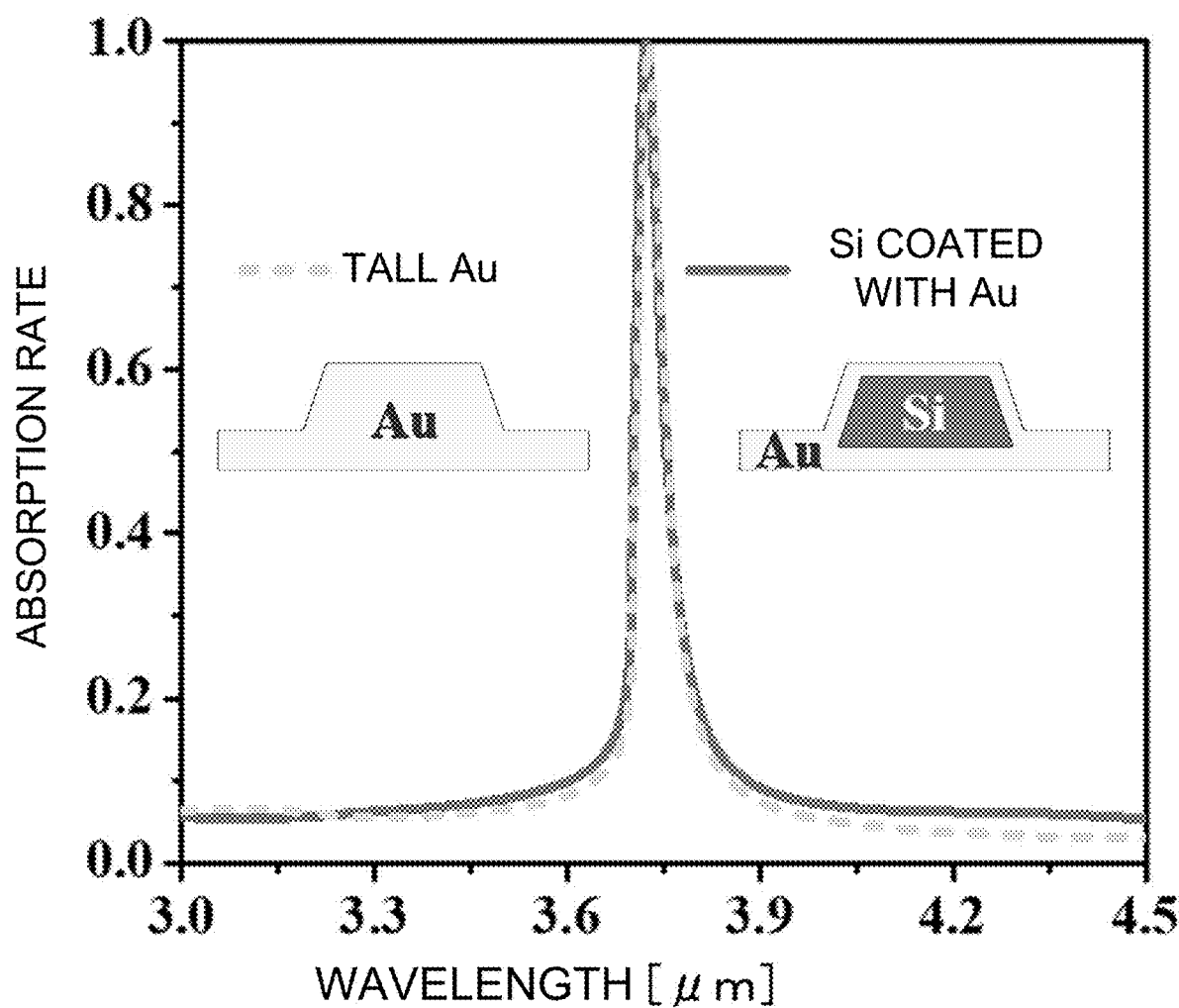
FIG. 11 is a diagram illustrating a difference in absorption spectrum between a case where Au is used up to the inside of the disk structure and a case where Si is used up to the inside. Since light absorption occurs on the surface, there is almost no difference between them.

This was further simulated. FIG. 11 illustrates simulation results of the light absorption spectrum of the wavelength selection elements used in the photosensor according to the present invention, which have structures of a tall Au disk (indicated by a broken line) and a Si disk (indicated by a solid line) coated with Au having a thickness of 80 nm. Here, these two wavelength selection elements have the same parameters. Specifically, the period was 3.7 μm, and the diameter and height of the disk were 1.85 μm and 0.34 μm, respectively. Both of these two perfect absorbers had a period of 3.7 μm, and both showed an absorption rate of 0.99 at a resonance wavelength of 3.722 μm, and were confirmed to be almost perfect absorbers. In addition, the wavelength resolution was 51 nm, and the Q factor was 71.

Note that, although a pyroelectric element, a bolometer, a thermoelectromotive element, or the like can be used as the thermal detector, a ZnO pyroelectric element is adopted as the thermal detector in the example described below. However, of course, other types of thermal detectors can be used as well, and even when a pyroelectric element is used, its material may be other than ZnO.

In addition, in the following, as an example of the present invention, a four-wavelength infrared sensor in which four single wavelength sensors having different wavelengths according to the present invention are integrated on a single Si chip will be described in detail as an example. However, it should be noted that the present invention is not intended to be limited to such a configuration in which a plurality of single wavelength sensors is combined and integrated, and even a single wavelength sensor or a combined, integrated, or the like configuration is included in the technical scope of the present invention.

EXAMPLE

Figure 9:
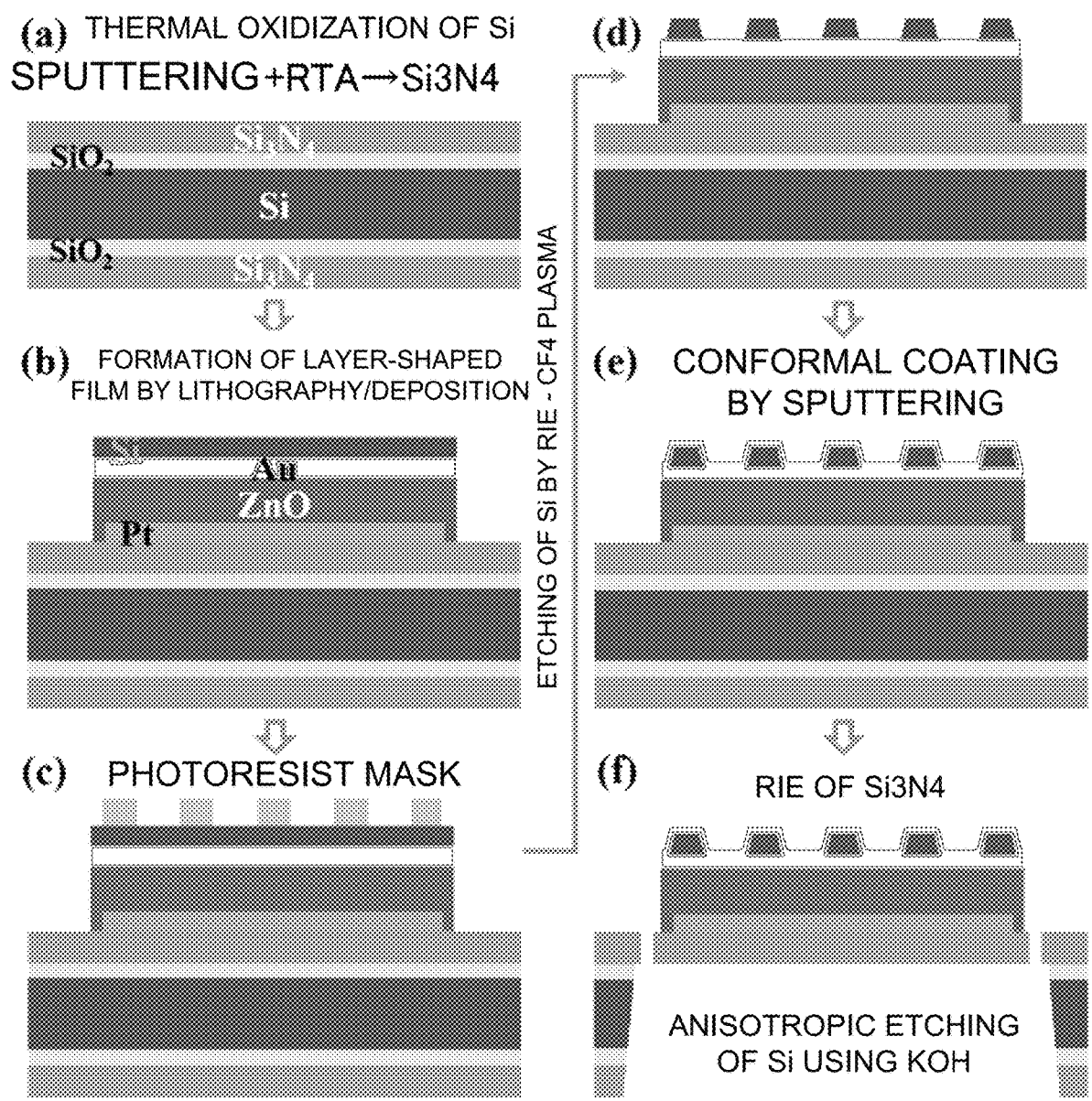
FIG. 9 is a schematic diagram of a process for manufacturing an infrared sensor manufactured in the present invention. (a) A silicon oxide film of 100 nm and a $Si_3N_4$ film of 350 nm are formed by sputtering on both surfaces of a double-side polished wafer. (b) A Pt electrode is formed on the $Si_3N_4$ film, which is the upper surface, and a ZnO pyroelectric film, an Au electrode, and a silicon template layer for a perfect absorber are formed thereon. (c) Resist is exposed by laser drawing and after development, a mask pattern for disk formation for reactive ion etching (RIE) is formed. (d) RIE of Si is performed using a mask to form a Si disk structure. (e) A conformal Au film is formed by sputtering on the Si disk. (f) The $Si_3N_4$ film, which is the uppermost layer, is etched by RIE to manufacture a thermal insulation structure. Using the backside $Si_3N_4$ film as a mask, Si is etched using KOH to manufacture a membrane structure.

The photosensor of the present invention will be described in more detail by taking, as an example, a four-wavelength (quad-wavelength IR sensor) infrared sensor in which four photosensors according to the present invention having absorption wavelengths shifted from each other are integrated on a single chip. Here, several steps of direct laser writing lithography with film deposition and lift-off, reactive generation ion etching (RIE), and anisotropic wet etching were performed on a 3-inch double-side polished Si substrate. A set of 25 four-wavelength infrared sensors was disposed on the substrate. This production procedure is illustrated in FIG. 9.

As discussed above, instead of using a tall Au disk (340 nm) array in the photosensor of the present invention with a 2D structure, an 80 nm thick Au film coated on a 340 nm thick Si disk array was used to save gold usage, and this configuration was adopted so that basically the same performance as the tall Au disk array was provided. The periodicities of four plasmonic array sensors designed such that their resonance falls within the atmospheric window wavelength band, which is infrared transparent in an MWIR (mid-wavelength infrared, medium wavelength infrared, wavelength 3 to 8 μm) region, was 3.5 μm, 3.7 μm, 3.8 μm and 3.9 μm, respectively. Here, a 100 nm thick Pt film deposited by electron beam (EB) deposition was used as the bottom electrode, but this film also functions as an epitaxial substrate having a (111) plane for growing a ZnO (0001) film with high crystallinity.

Hereinafter, a method for producing the four-infrared wavelength sensor will be described in detail. In FIG. 9, first, the 3-inch double-side polished Si wafer was thermally oxidized by dry oxidation at 1150° C. to form a SiO$_2$ layer having a thickness of about 100 nm on both sides of the Si wafer. Next, a 350 nm-thick Si$_3$N$_4$ film was deposited on both sides of the SiO$_2$/Si wafer by direct current (200 W) reactive sputtering using a boron-doped Si target and an Ar/N$_2$ (18/10 sccm) mixture gas (sputter i_Miller CFS-4EP-LL of Shibaura Mechatronics Corporation was used) (FIG. 9(*a*)).

Then, a rapid thermal annealing (RTA) process was applied (specifically, heating at a rate of 5° C./sec, maintaining at a constant temperature at 1000° C. for one minute, followed by natural cooling) in a N$_2$ atmosphere on the sputtered Si$_3$N$_4$/SiO$_2$/Si substrate to improve the quality (hardness) of the Si$_3$N$_4$ film. Next, a photoresist pattern was generated as a mask for a lift-off process of the bottom Pt film electrode by a maskless lithography process. A 100 nm-thick Pt film for sensor bottom electrode with a 10 nm-thick adhesive Ti layer was deposited on the Si$_3$N$_4$/SiO$_2$/Si substrate by an electron beam deposition apparatus (UEP300-1C from ULVAC, Inc.) using the patterned photoresist mask. The lift-off process was performed using a PG remover. For patterning the ZnO pyroelectric film and the top Au electrode (by sputtering and electron beam deposition, respectively), the same maskless lithography process as described above was applied. Here, it is noted that RF sputtering processing (300 W) using the ZnO target and the Ar/O$_2$ mixture gas (16/04 sccm) was used for epitaxial growth of the ZnO film with high crystallinity on the Pt bottom film electrode. After the top Au electrode was manufactured, a 340 nm-thick amorphous Si (boron-doped)

film was patterned on the top Au electrode as a template layer for an Au disk array (FIG. 9(b)).

The photoresist disk array designed for each four-wavelength infrared sensor as an RIE mask for etching Si was patterned on an Si template using a direct laser drawing lithography process (FIG. 9(c)).

Next, Si around the photoresist disk was etched using RIE processing (FIG. 9(d)).

The remaining photoresist was removed by $O_2$ plasma and acetone. An Au disk array of a plasmonic absorber (perfect absorber) having a two-dimensional periodic structure was finally formed by applying the above-described maskless lithography processing by CD sputtering of an 80 nm-thick Au film after a 5 nm-thick adhesive Ti layer (FIG. 9(e)).

The four-wavelength IR sensor chip on the 3-inch wafer was then processed for thermal isolation from a membrane support. Here, an AZ-514E photoresist RIE mask of the $Si_3N_4$ layer (for membranes and for thermal isolation slits around individual single wavelength sensors) was first patterned. Then, a $Si_3N_4$ mask for anisotropic wet etching of Si was then formed using RIE processing ($CHF_3$ plasma). After the sensor chip in the top of the Si wafer was protected by a polymer protection layer (ProTEK B3-25 on ProTEK (trademark) B3 primer), the Si substrate at the bottom of each single wavelength sensors was fully etched by slow anisotropic wet etching using a heated KOH solution (8 mg/L, 80° C.) (FIG. 9(f)).

Then, the sensor chip wafer was held in the PG remover for one day and finally rinsed with acetone before it was separated into four-wavelength IR membrane sensor chips having a size of 1×1 cm².

Figure 10:
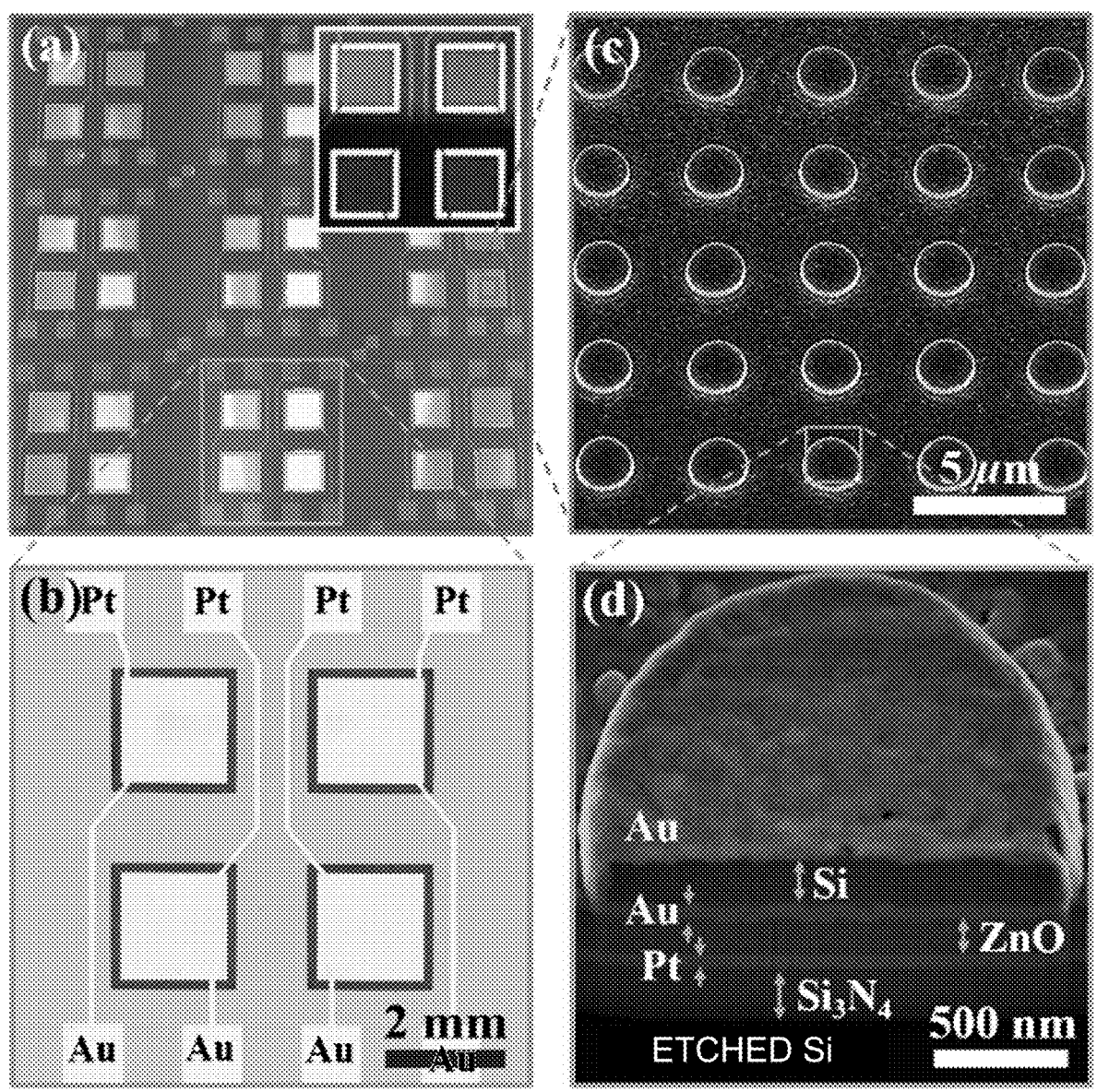
FIG. 10(a) is a photograph of a chip in which nine sets of four-wavelength detection type membrane pyroelectric sensors are integrated. The insert photograph shows one four-wavelength sensor. It can be seen that white light leaks from the back surface through a thin membrane portion made of $Si_3N_4$ for thermal insulation. (b) An optical microscope photograph of one four-wavelength sensor. (c) A scanning electron microscope (SEM) photograph of a sensor with a period of 3.7 μm viewed from above. (d) A photograph of a cross section of the device captured by the SEM from obliquely above.

FIG. 10 summarizes the morphological characteristics of the produced four-wavelength infrared membrane sensor. FIG. 10(a) is a photograph of nine sets of four-wavelength infrared sensor chips made of the entire 3-inch wafer. The insert photograph illustrated in the upper right part of this drawing is a photograph of the produced typical four-wavelength infrared sensor while white light is emitted from the bottom. From this insert photograph, it can be seen that there is an optically transparent $Si_3N_4$ film around each of the single wavelength sensor, indicating that the produced sensor is sufficiently held by the $Si_3N_4$ film (see also FIG. 9(f)).

FIG. 10(b) is a bright-field optical microscope image illustrating the entirety of one four-wavelength infrared sensor including four single wavelength sensors, and also indicating a scale bar having a length of 2 mm. From this, it can be seen that in the produced sensor, each single wavelength sensor has a size of 2×2 mm², and the size of the entire four-wavelength infrared sensor is 1×1 cm².

A top SEM image illustrated in FIG. 10(c) illustrates a produced typical four-wavelength infrared sensor according to the present invention. The cross-sectional image illustrated in FIG. 10(d) illustrates the structure of the present sensor, which reveals that the use of the fabrication process described above successfully constructs an Au shell disk supported by the Si core template. The dimensional parameters of the films and layers in the sensors such as the plasmonic disk array, the Au top electrode, the pyroelectric element ZnO film, the bottom Pt electrode, and the $Si_3N_4$ film were clearly read and verified from FIG. 10(d), but these were the same as the design values.

Note that the SEM image of the produced four-wavelength infrared sensor was obtained at an acceleration voltage of 5 kV using a scanning electron microscope (SU8230 from Hitachi High-Technologies Corporation). In acquiring the cross-sectional SEM image, a rectangular through-hole was generated in the membrane sensor chip using a focused ion beam miller (FB-2100 from Hitachi High-Technologies Corporation).

The performance (spectral response) of the produced four-wavelength infrared sensor was measured using a wavelength-variable infrared laser system as a frequency-variable excitation source. The characteristics of the infrared laser output from this system included a broad spectral linewidth with a Q factor of about 10 to 15, a collimated beam diameter (diameter) of 1 mm, a repetition frequency of 1 kHz, and an average power of a few milliwatts (wavelength dependent). In the measurement, the sensor to be measured was directly irradiated with a laser beam having a diameter of 1 mm. It should be noted that since the spectral linewidth of the output infrared pulse laser was extremely wider than the absorption bandwidth of the infrared sensor to be measured, the spectral response of the infrared sensor became broad. The spectral response of each infrared sensor was calculated by deconvolving the spectral output voltage of the infrared sensor with the measured spectral power distribution of the infrared laser. The time response characteristics of the produced infrared sensor were measured using a combination of a high-performance oscilloscope (500 MHz, using TDS 520A from Tektronix, Inc.) with amplifier SR560.

Figure 12:
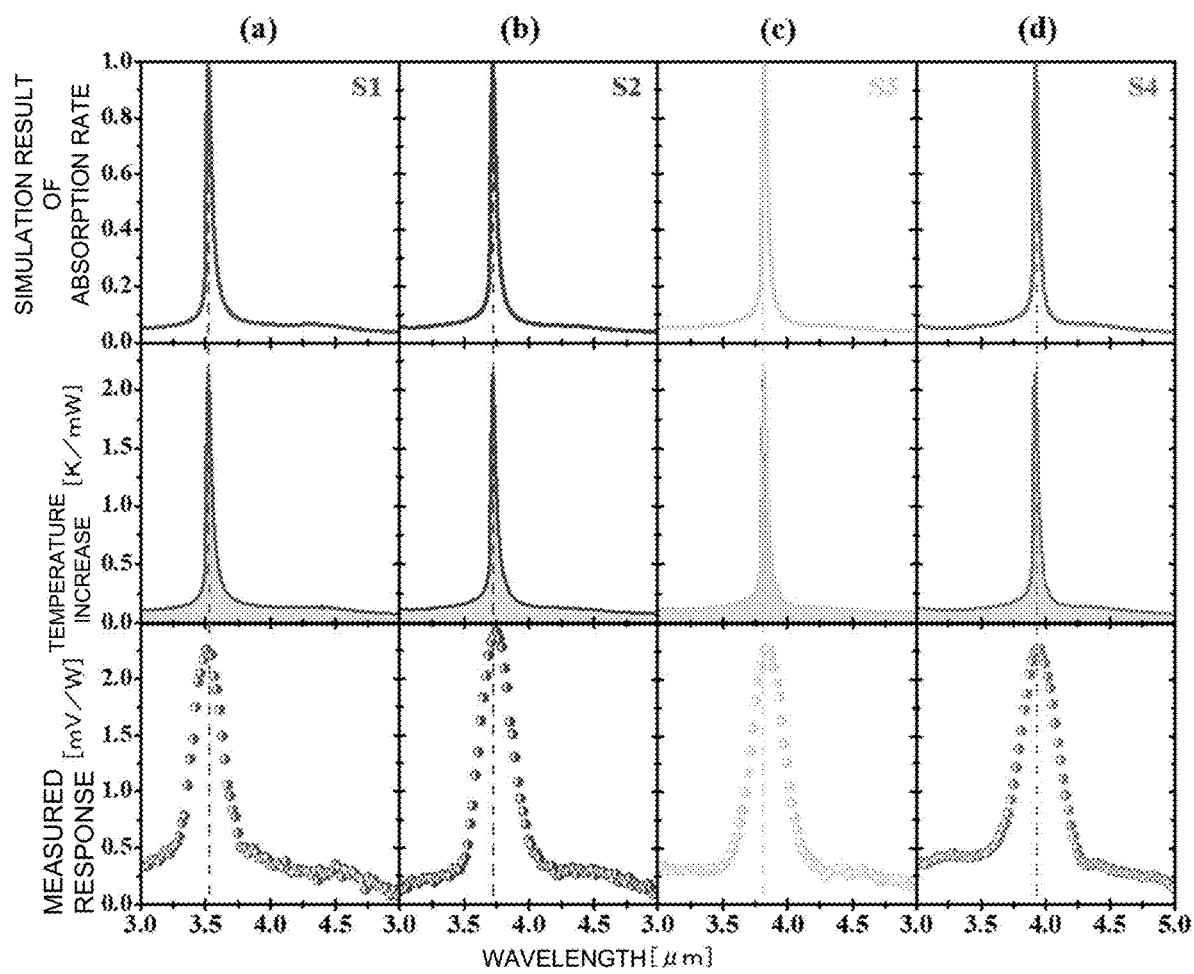
FIG. 12 is a diagram illustrating optical responsiveness, temperature rise, and wavelength dependency of an electrical signal of a four-wavelength detection type membrane pyroelectric sensor. Wavelength in column (a): 3.522 μm ($\lambda_1$); column (b): 3.722 μm ($\lambda_2$); column (c): 3.822 μm ($\lambda_3$); column (d): 3.922 μm ($\lambda_4$). Top row: simulation of absorption spectrum; second row: results of simulation of temperature rise spectrum; and bottom row: spectral sensitivity curve measured by experiment.

FIG. 12 illustrates, from top to bottom, a simulation result of an absorption spectrum in the first row, a simulation result of an average thermal increase spectrum in the second row, and a curve of a measurement result of a spectral response in the third row. Here, columns (a) to (d) of FIG. 12 illustrate simulation or measurement results for the single wavelength sensor in the four-wavelength infrared sensor. The resonance wavelengths of the single wavelength sensors corresponding to columns (a) to (d) were 3.522 μm ($\lambda_1$), 3.722 μm ($\mu_2$), 3.822 μm ($\lambda_3$), and 3.922 μm ($\lambda_4$), respectively. Here, in these four types of single wavelength sensors, the disk heights were all 340 nm, but the periods p were 3.5 μm (corresponding to $\lambda_1$), 3.7 μm (corresponding to $\lambda_2$), 3.8 μm (corresponding to $\lambda_3$), and 3.9 μm (corresponding to $\lambda_4$), respectively, and the diameter of each disk was set to ½ of each period.

As can be seen from the four graphs arranged in the top row of FIG. 12, the simulation result of the optical response spectrum of the four-wavelength infrared sensor (more precisely, the response spectrum of each of the four single wavelength sensors constituting the four-wavelength infrared sensor; hereinafter the same applies) is almost 1 (0.99) at the peak and is very narrow (half width: 50 nm). This proves that the designed sensor can efficiently absorb infrared light at each resonance wavelength. Indeed, from the simulation results of the average temperature increase on the pyroelectric element ZnO film at thermal equilibrium in each of the four single wavelength sensors illustrated in the four graphs arranged in the middle row of FIG. 12, it is clearly seen that this four-wavelength infrared sensor can almost completely absorb infrared light in a narrow spectral bandwidth at the designed resonance wavelength, and thus the absorbed infrared energy for the absorption spectrum is converted into heat, and the induced heat is transferred to the ZnO detection layer. As expected, the measured spectral response curves illustrated in the graphs in the bottom row of FIG. 12 clearly prove that the design according to the technical idea of the present invention is correct.

All the four single wavelength sensors in the produced four-wavelength infrared sensor chip showed narrow spectral response curves, and these responses were in good agreement with the simulation results of the absorption spectrum performed in advance. The reason why the measured spectral response curve became broad as compared with the simulation results of the absorption rate and the temperature rise spectrum is that the spectral linewidth of the infrared pulse laser used for the measurement was wide (Q factor of 10 to 15) as described above.

Figure 13:
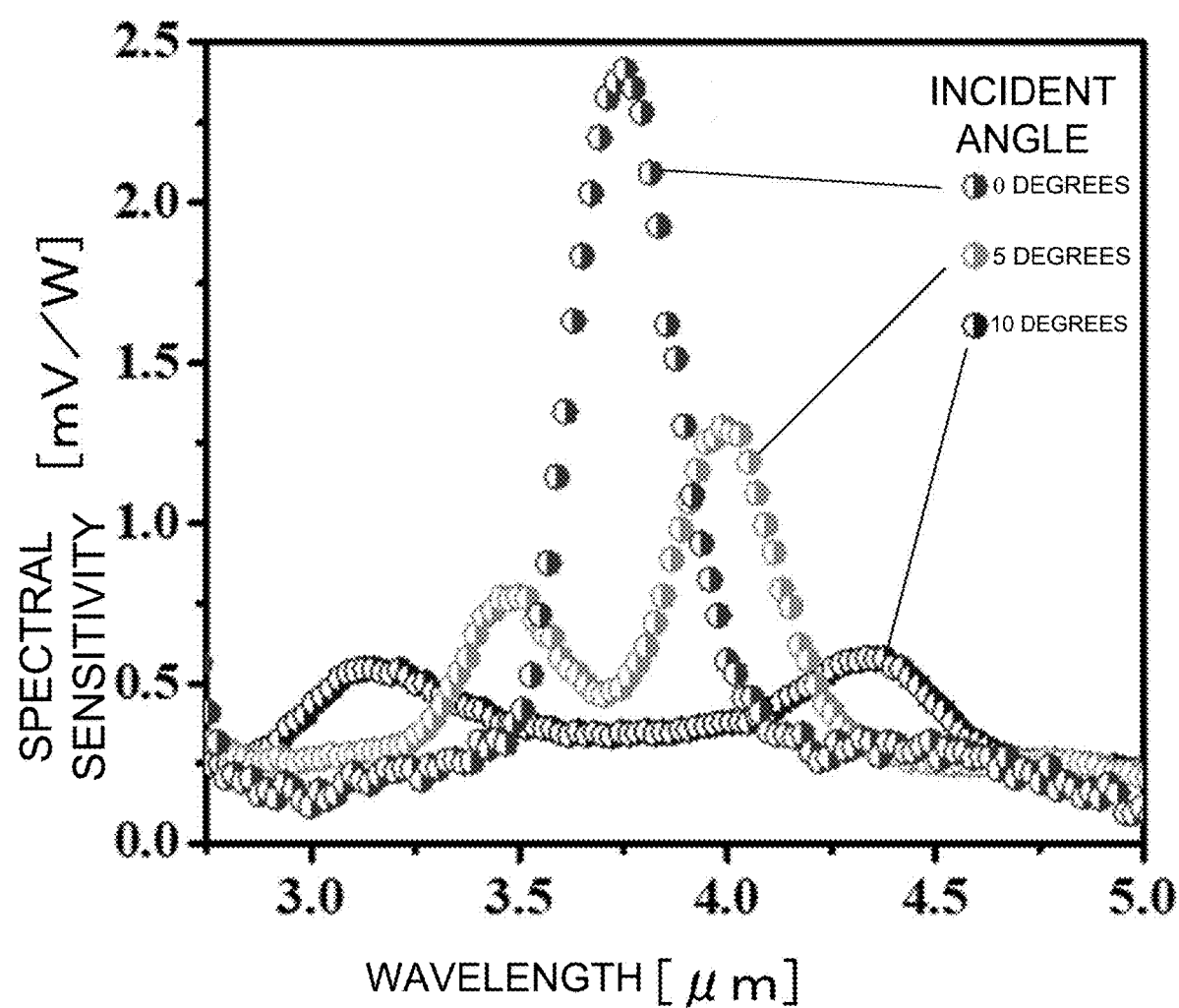
FIG. 13 is a diagram illustrating angular dependency of a spectral sensitivity curve of a sensor having a resonance wavelength of 3.722 μm measured by experiment. When the incident angle deviates from perpendicular, the intensity greatly decreases.

The sensor of the present invention, which is a plasmonic array in a diffraction grating shape having a 2D periodic structure as described above, has dependency on the incident angle. Therefore, by measuring this dependency, the angular response characteristics of the present sensor were verified. In FIG. 13, spectral response curves of a single wavelength sensor having a period of 3.7 μm were plotted in a case where the incident angle was in a direction perpendicular to the surface (indicated as 0 degrees in the drawing) and in a case where the incident angle was inclined by 5 degrees and 10 degrees from the perpendicular direction (indicated as 5 degrees and 10 degrees, respectively, in the drawing). Interestingly, while the resonance is dependent on the incident angle, when the incident angle was inclined from the perpendicular direction, its response decreased rapidly as the inclination angle increased. This indicates that the sensor according to the present invention has high directivity in the perpendicular direction.

Figure 15:
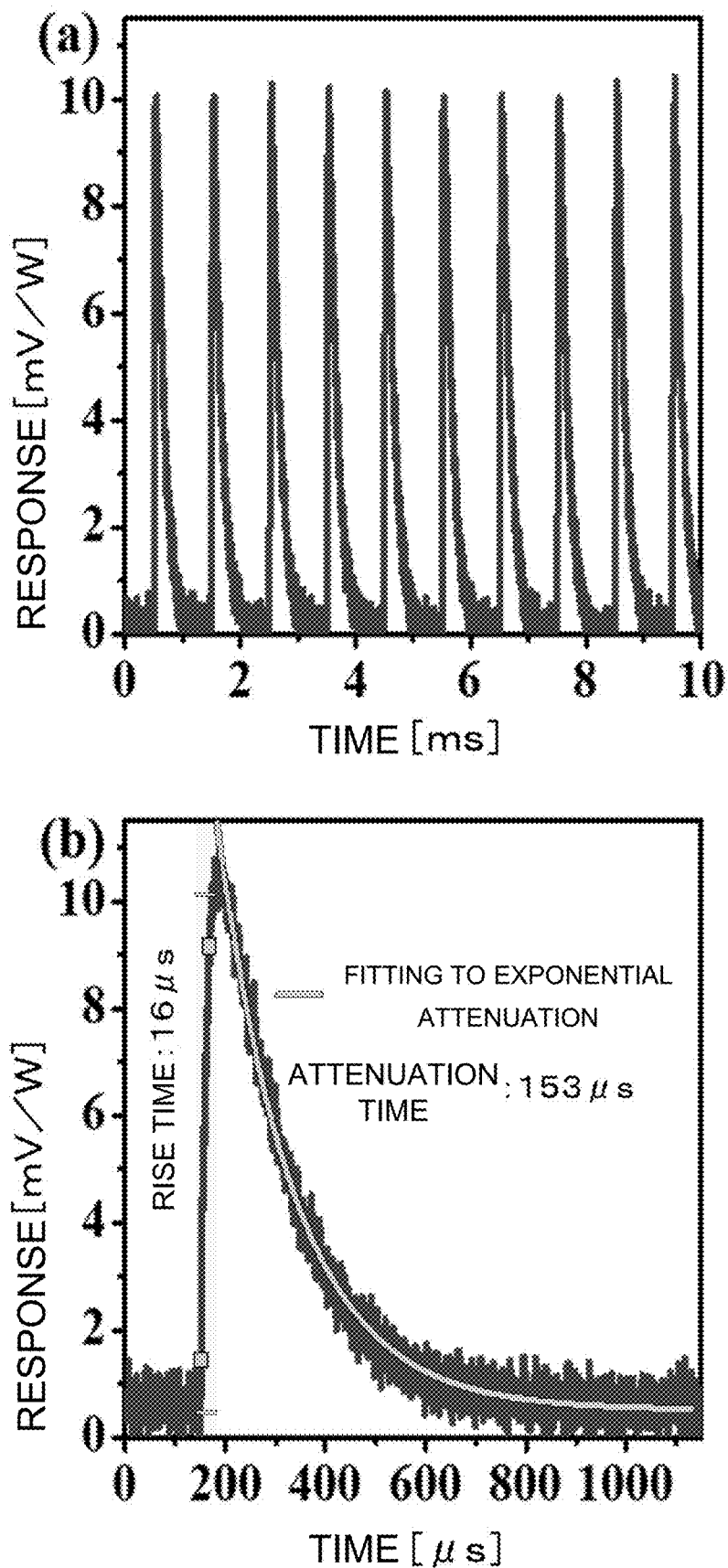
FIG. 15 is a diagram illustrating time responsiveness of a sensor having a resonance wavelength of 3.722 μm. Pulsed light having a time width of 104 femtoseconds with a resonance wavelength was emitted. (a) Confirmation of stability by emission of 10 pulses. (b) Response to one pulse. It has a rise time of 16 microseconds and an attenuation time of 153 microseconds.

To understand the dynamic response of the present device, the time response of the single wavelength sensor of the present invention with respect to a 104 femtosecond pulsed laser resonating at a wavelength of 3.722 μm was measured as a test using a high performance oscilloscope. The results are illustrated in FIG. 15. Here, the fact that the response (FIG. 15(a)) of the sensor measured by applying 10 pulses at a cycle of 1 msec is uniform indicates the high-speed responsiveness and stability of the present sensor. In addition, the impulse response (FIG. 15(b)) of the present sensor measured by stimulation with a single pulse indicates a high-speed responsiveness of 16 μsec and attenuation of 153 μsec, which can be sufficiently used for practical devices.

In the example of the present application, a four-wavelength infrared sensor configured by integrating four single wavelength sensors according to the present invention whose resonance wavelengths are shifted from each other on a chip is produced, but this can be easily expanded to a sensor with more multiple wavelengths applicable to practical applications. The photosensor of the present invention can be applied to, but not limited to, a portable spectroscopic infrared measuring instrument that can be used for a multicolor radiation thermometer or the like, color imaging used for environment recognition or the like, remote sensing and imaging for air pollution detection, and the like. In addition, although the sensor of the present invention exhibits high directivity in the perpendicular direction, it is possible to further improve the directivity by adopting a pinhole aperture or a collimator. Of course, it is also possible to use the single wavelength sensor alone without integration. In addition, as described above, the resonance wavelength of the single wavelength sensor according to the present invention is not limited to the MWIR region, and can be applied to ultraviolet, visible, and various infrared regions while maintaining its basic structure.

Figure 14:
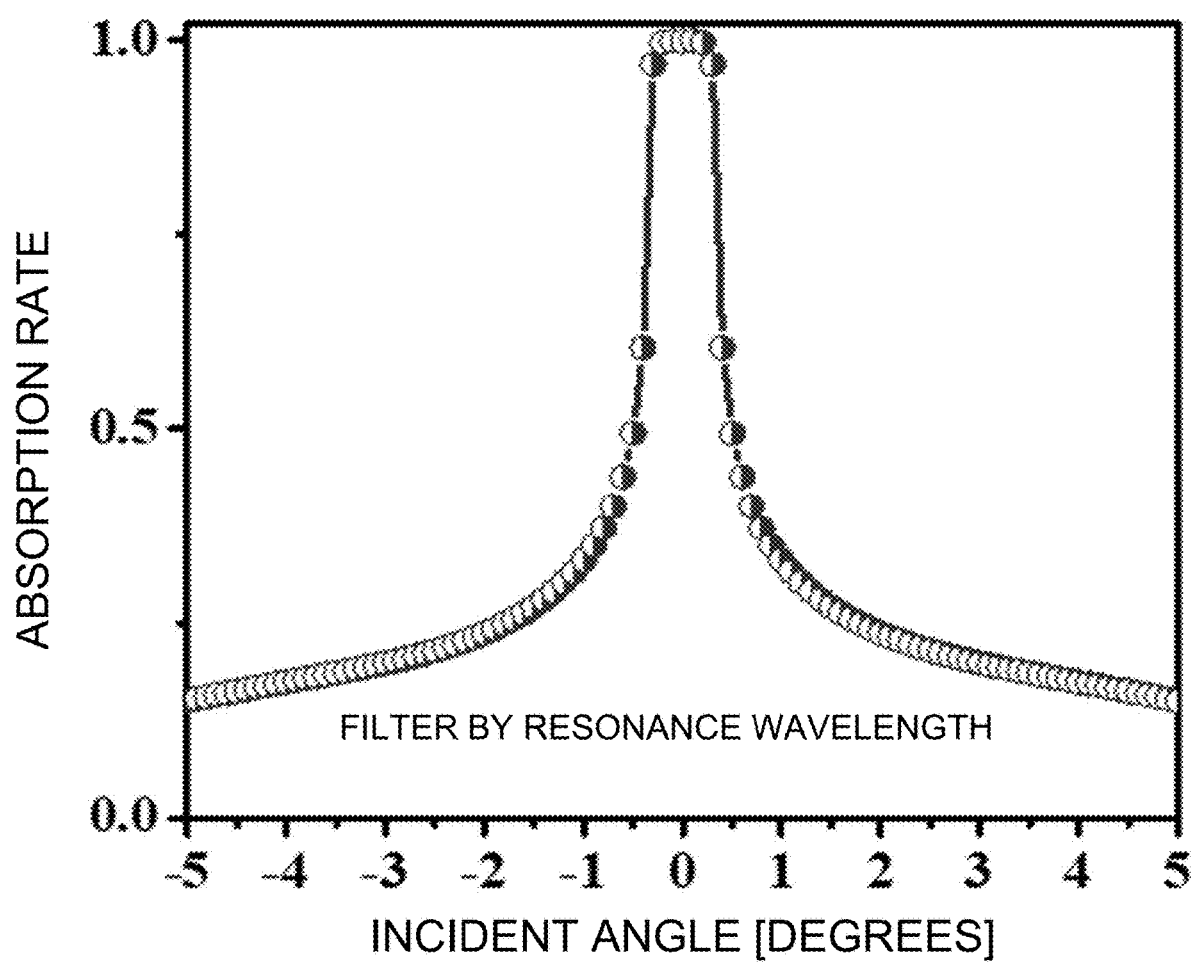
FIG. 14 is a diagram illustrating dependency of an incident angle of an absorption rate with respect to light having a resonance wavelength in a sensor having the same design as in the case of FIG. 13. It has directivity of a half width of about 1°.

Furthermore, when the single sensor of the present invention is used with monochromatic light at its resonance wavelength, its detection angle can be extremely narrow, for example, 1 degree or less. FIG. 14 illustrates a simulation result of a change in absorption rate when an incident angle of light is changed in a range of ±5 degrees from a direction perpendicular to the sensor surface (in the drawing, the incident angle=0 degrees) while light of a resonance wavelength is applied to the single wavelength sensor according to the present invention. As can be seen from the drawing, the absorption rate decreases from 1 to ½ or less only when the deviation of the incident angle from the perpendicular direction is ±0.5 degrees, and furthermore the absorption rate decreases to about ⅓ when the deviation is ±1 degree. Note that, after the absorption rate decreases to about ⅓, the decrease in the absorption rate with respect to the increase in the deviation of the incident angle becomes slightly slow. If it is desired to more sharply detect that the incident angle has increased to a certain extent or more, it is not limited thereto, but for example, in a case where the deviation of the incident angle is about ±0.5 degrees to 1 degree, the detection sensitivity is low, but in a case where the deviation has further increased, it is also possible to cope with the deviation by using another type of sensor capable of more sharply detecting than that illustrated in FIG. 14 in combination.

CITATION LIST

Non-Patent Literature

Non-Patent Literature 1: S. Ogawa, K. Okada, N. Fukushima, M. Kimata, Appl. Phys. Lett. 2012, 100, 021111.
Non-Patent Literature 2: T. D. Dao, S. Ishii, T. Yokoyama, T. Sawada, R. P. Sugavaneshwar, K. Chen, Y. Wada, T. Nabatame, T. Nagao, ACS Photonics 2016, 3, 1271.
Non-Patent Literature 3: J. Y. Suen, K. Fan, J. Montoya, C. Bingham, V. Stenger, S. Sriram, W. J. Padilla, Optica 2017, 4, 276.
Non-Patent Literature 4: T. D. Dao, S. Ishii, T. Yokoyama, T. Sawada, R. P. Sugavaneshwar, K. Chen, Y. Wada, T. Nabatame, T. Nagao, ACS Photonics 2016, 3, 1271.
Non-Patent Literature 5: Appl. Phys. Lett. 2008, 92, 141114.
Non-Patent Literature 6: Physical Review B 72, 075127 (2005).
Non-Patent Literature 7: Optics Express, Vol 27, A725-A737(2019).
Non-Patent Literature 8: E. D. Palik, Handbook of Optical Constants of Solids, Academic Press: New York, 1998.
Non-Patent Literature 9: T. D. Dao, S. Ishii, T. Yokoyama, T. Sawada, R. P. Sugavaneshwar, K. Chen, Y. Wada, T. Nabatame, T. Nagao, ACS Photonics 2016, 3, 1271.

The invention claimed is:

1. A photosensor which is a sensor capable of detecting light, the photosensor comprising:
  an absorber having an entire surface formed of only one of a metal and a dielectric and configured to absorb incident light; and
  means for detecting heat generated by absorption of light by the absorber, wherein the absorber absorbs light that is perpendicularly incident on a surface of the absorber and has a same wavelength as a resonance wavelength of the absorber,
  the surface of the absorber includes a plurality of raised portions that are raised,
  the surface of the absorber has a periodic structure in which the plurality of raised portions are arranged at a predetermined period such that a one-dimensional or two-dimensional lattice pattern is formed,
  in the one-dimensional lattice pattern,
  each of the plurality of raised portions is formed in an elongated manner and is arranged at a first period along a predetermined direction so as to be parallel to each other,
  widths of the raised portions are 0.3 to 0.7 times the first period, thicknesses of the raised portions are 0.05 to 0.2 times the first period, in the two-dimensional lattice pattern,
- each of the plurality of raised portions is arranged at a second period so as to be set out in a grid,
- widths of the raised portions are 0.3 to 0.7 times the second period,
- thicknesses of the raised portions are 0.05 to 0.2 times the second period, and
- each of a plurality of modes of surface plasmon polaritons or surface phonon polaritons excited by a surface parallel component of light incident on the absorber and a momentum obtained from the lattice pattern and propagating over the surface of the absorber is in a degenerate state when the light incident on the absorber is incident perpendicularly to the surface and a wavelength is the resonance wavelength.

2. The photosensor according to claim 1, wherein
the raised portions are arranged in the two-dimensional lattice pattern, and
the absorption of light by the absorber has no polarization dependency.

3. The photosensor according to claim 2, wherein
the raised portions are formed in a shape which maintains symmetry of the two-dimensional lattice pattern.

4. The photosensor according to claim 1, wherein
the raised portions are arranged in the one-dimensional lattice pattern, and
the light absorbed by the absorber is light in a specific polarization direction.

5. The photosensor according to claim 1, wherein
the means for detecting heat is means for detecting a temperature rise due to the heat.

6. The photosensor according to claim 5, wherein the means for detecting a temperature rise is a pyroelectric element or a bolometer.

7. The photosensor according to claim 1, wherein the metal has a thickness of 50 nm or more on surfaces of the raised portions.

8. The photosensor according to claim 1, wherein
the absorber absorbs 90% or more of the light that is perpendicularly incident on the surface of the absorber and has the same wavelength as the resonance wavelength of the absorber.

9. The photosensor according to claim 1, wherein
the metal is selected from Au, Ag, and Al, and the dielectric is selected from Si, Ge, $Al_2O_3$, $TiO_2$, $SiO_2$, and SiC.

10. The photosensor according to claim 1, wherein a bandwidth of light to be detected corresponds to a Q factor of 50 or more.

11. The photosensor according to claim 1, wherein a detection sensitivity half-value angle from a direction in which detection sensitivity is highest is +1 degree or less.

12. The photosensor according to claim 1, wherein
the direction in which the detection sensitivity is highest is a direction perpendicular to the surface of the absorber.

13. A sensor unit comprising a plurality of the photosensors according to claim 1, arranged on a single chip.

14. The sensor unit according to claim 13, wherein at least one photosensor of the plurality of the photosensors has a detection wavelength different from a detection wavelength of any other one of the plurality of the photosensors.

15. The sensor unit according to claim 14, wherein
the one photosensor is different from the any other one of the photosensors in the period in which the raised portions are arranged.

16. The sensor unit according to claim 13, wherein
a thermal barrier is provided in at least a partial region between the plurality of the photosensors.

17. An object detection apparatus comprising:
the sensor unit according to claim 13,
wherein each photosensor in the sensor unit detects light coming from an object in a specific direction, and detects presence or movement of the object according to the detected light.

18. The object detection apparatus according to claim 17, wherein the object is selected from an article, an animal, and a human.

19. The object detection apparatus according to claim 17, wherein the photosensor detects infrared light coming from the object.

* * * * *